United States Patent
Chiang et al.

(10) Patent No.: US 10,741,558 B2
(45) Date of Patent: Aug. 11, 2020

(54) NANOSHEET CMOS DEVICE AND METHOD OF FORMING

(71) Applicant: Taiwan Semiconductor Manufacturing Co., Ltd., Hsin-Chu (TW)

(72) Inventors: Hsin-Che Chiang, Taipei (TW); Chun-Sheng Liang, Changhua County (TW); Kuo-Hua Pan, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/357,682

(22) Filed: Mar. 19, 2019

(65) Prior Publication Data

US 2020/0058653 A1 Feb. 20, 2020

Related U.S. Application Data

(60) Provisional application No. 62/718,823, filed on Aug. 14, 2018.

(51) Int. Cl.
| | |
|---|---|
| *H01L 27/092* | (2006.01) |
| *H01L 29/78* | (2006.01) |
| *H01L 29/16* | (2006.01) |
| *H01L 29/24* | (2006.01) |
| *H01L 29/49* | (2006.01) |

(Continued)

(52) U.S. Cl.
CPC .... *H01L 27/0924* (2013.01); *H01L 21/02532* (2013.01); *H01L 21/28088* (2013.01); *H01L 21/823807* (2013.01); *H01L 21/823821* (2013.01); *H01L 21/823842* (2013.01); *H01L 29/0673* (2013.01); *H01L 29/16* (2013.01); *H01L 29/24* (2013.01); *H01L 29/4966* (2013.01); *H01L 29/6681* (2013.01); *H01L 29/66545* (2013.01); *H01L 29/7854* (2013.01)

(58) Field of Classification Search
CPC ..... H01L 21/823821; H01L 21/823431; H01L 21/823487; H01L 21/823885; H01L 27/0886; H01L 27/0924; H01L 27/10879; H01L 29/785; H01L 29/66666; H01L 29/7827; H01L 29/66545
See application file for complete search history.

(56) References Cited

U.S. PATENT DOCUMENTS

| | | |
|---|---|---|
| 8,796,666 B1 | 8/2014 | Huang et al. |
| 8,815,712 B2 | 8/2014 | Wan et al. |

(Continued)

*Primary Examiner* — Hsien Ming Lee
(74) *Attorney, Agent, or Firm* — Haynes and Boone, LLP

(57) ABSTRACT

A method of forming a semiconductor device includes providing a fin extruding from a substrate, the fin having first epitaxial layers alternating with second epitaxial layers, the first epitaxial layers including a first semiconductor material, the second epitaxial layers including a second semiconductor material different from the first semiconductor material; etching sidewalls of at least one of the second epitaxial layers in a channel region of the fin, such that a width of the at least one of the second epitaxial layers in the channel region after etching is smaller than a width of the first epitaxial layers contacting the at least one of the second epitaxial layers; and forming a gate stack over of the fin, the gate stack engaging both the first epitaxial layers and the second epitaxial layers.

20 Claims, 19 Drawing Sheets

(51) Int. Cl.
  *H01L 29/66* (2006.01)
  *H01L 21/02* (2006.01)
  *H01L 21/28* (2006.01)
  *H01L 21/8238* (2006.01)
  *H01L 29/06* (2006.01)

(56) References Cited

U.S. PATENT DOCUMENTS

| | | |
|---|---|---|
| 8,963,258 B2 | 2/2015 | Yu et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 9,853,101 B2 | 12/2017 | Peng et al. |
| 2013/0285116 A1 | 10/2013 | Lochtefeld et al. |
| 2017/0104061 A1* | 4/2017 | Peng .................. H01L 27/1211 |

* cited by examiner

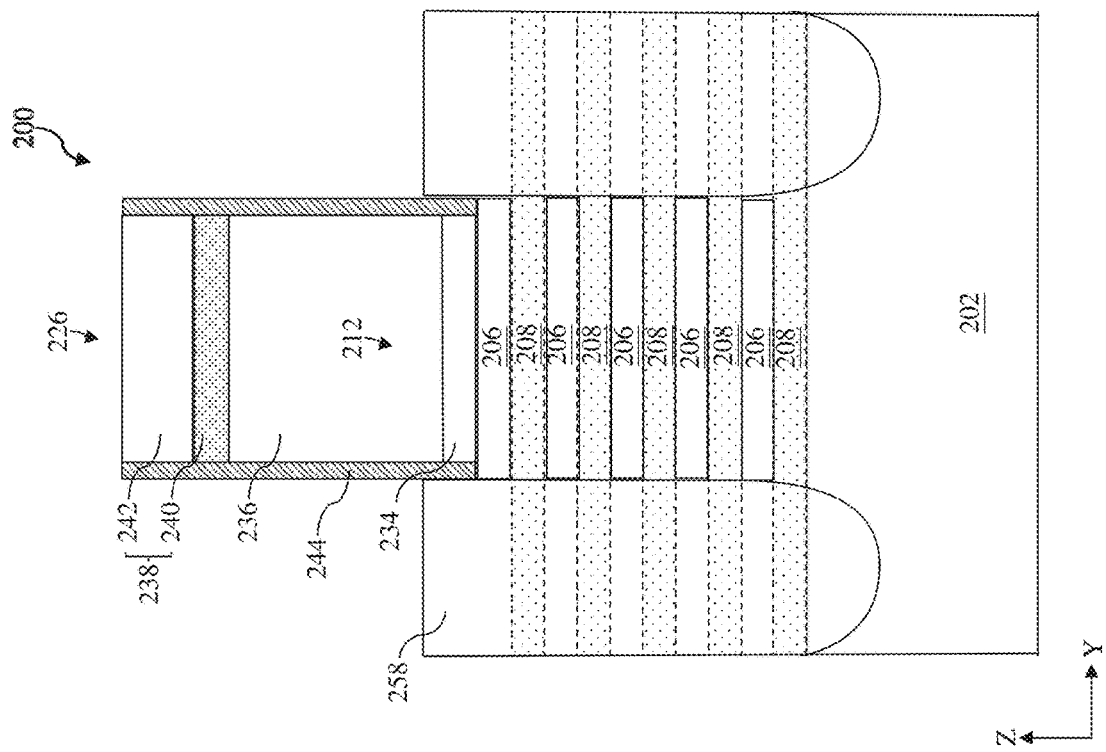
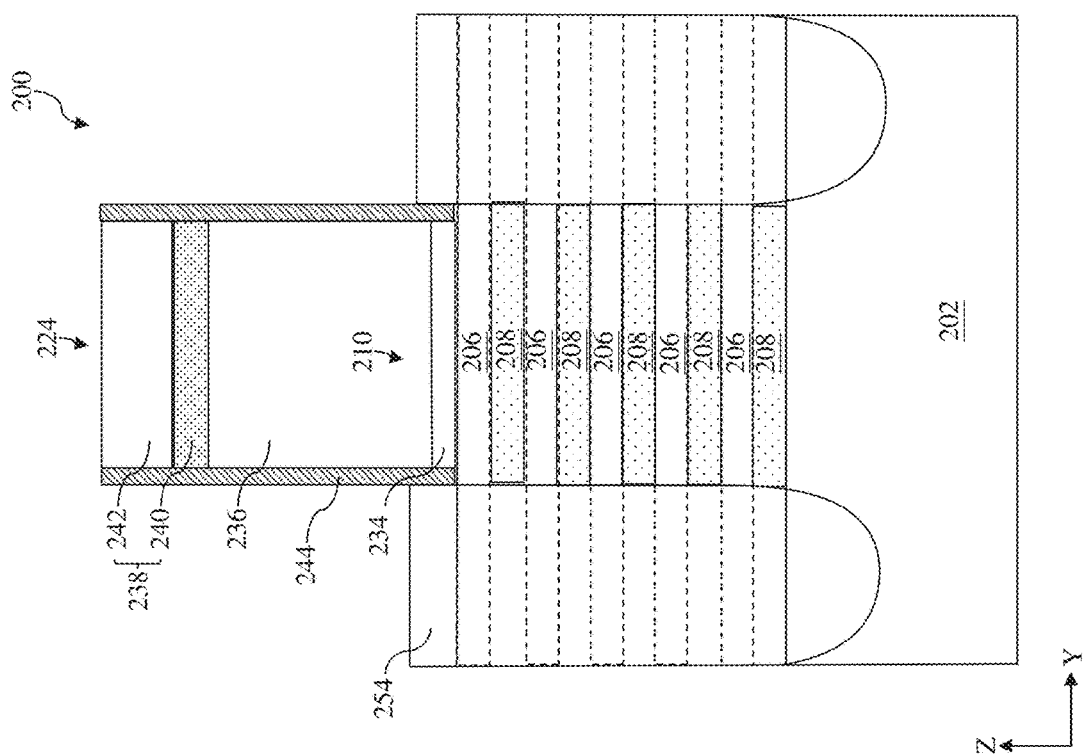

NANOSHEET CMOS DEVICE AND METHOD OF FORMING

PRIORITY

This application claims the benefit of the earlier filed provisional application U.S. Patent Application Ser. No. 62/718,823, filed Aug. 14, 2018, and entitled "Semiconductor Devices with Dendrite Structure," which application is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Recently, nanosheet devices have been introduced in an effort to improve gate control by increasing gate-channel coupling, reduce OFF-state current, and reduce short-channel effects (SCEs). Nanosheet devices provide a channel in a stacked nanosheet structure, which allows gate structures to extend around the channel region providing access to the channel on two or four sides. In other words, the nanosheet structure increases the effective gate width in a transistor device. Nanosheet devices are compatible with conventional complementary metal-oxide-semiconductor (CMOS) processes and their structure allows them to be aggressively scaled while maintaining gate control and mitigating SCEs. The increased effective gate width may come with a tradeoff in a reduction of (110) plane. However, for p-type field effect transistors (FETs), a (110) plane provides the highest mobility for holes than other crystallographic planes (e.g., (100), (111) planes). Therefore, p-type FETs may not benefit as much as n-type FETs from a nanosheet structure. Accordingly, while the nanosheet configuration have been satisfactory in many respects, challenges with respect to performance of the resulting device may not be satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 7, 8, 9A, 9B, 10A, 10B, 11, 12, 13, 14, 15, 16A, 16B, 16C, 16D, and 17 illustrate cross-sectional views of a semiconductor structure during a fabrication process according to the method of FIGS. 3A and 3B, according to aspects of the present disclosure.

DETAILED DESCRIPTION

Figures 1A, 1B, 1C:
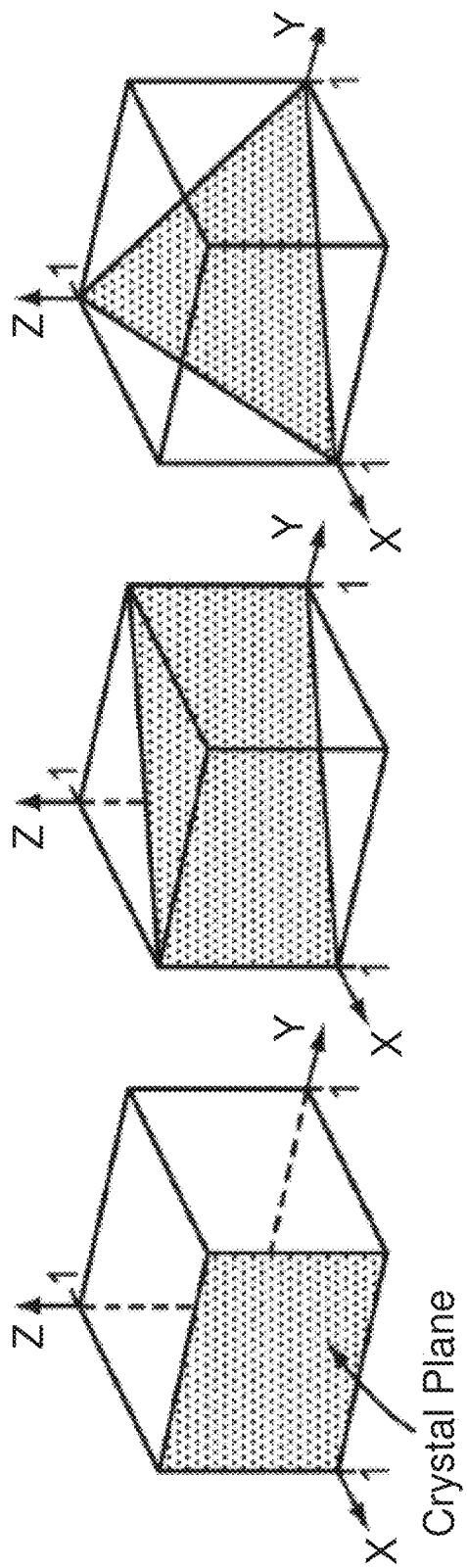
FIGS. 1A, 1B, and 1C are diagrams showing three types of crystallographic planes for a silicon.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and fabrication methods, and more particularly to Fin Field-Effect Transistors (FinFETs) with nanosheet structures and the methods of forming the same.

As scales of the fin width in FinFETs decreases, channel width variations could cause undesirable variability and mobility loss. Nanosheet transistors, such as gate-all-around (GAA) transistors, are being studied as an alternative to fin field effect transistors. In a GAA transistor, the gate of the transistor is made all around the channel (e.g., a nanowire channel or a bar-shaped channel) such that the channel is surrounded or encapsulated by the gate, which significantly increases effective gate width. With an increased effective gate width, a transistor has the advantage of improving the electrostatic control of the channel by the gate, which also mitigates leakage currents. However, in a GAA process flow, surface areas of different crystallographic planes of a channel may not all be increased. Surface areas of some crystallographic planes (e.g., a (110) plane) may even be decreased. However, some of the decreased crystallographic planes may provide higher mobilities for carriers in the channel.

FIGS. 1A-1C show three orientations of crystallographic planes of silicon. Silicon is widely used as a semiconductor material for the electronics industry. Most of silicon used to form silicon wafers is formed from single crystal silicon. The silicon wafers serve as the substrate on which transistor devices are formed. While described in connection with silicon substrates, however, the use of substrates that include, or consist essentially of, other semiconductor materials, is contemplated to be within the scope of the present invention.

In crystalline silicon, the atoms which make up the solid are arranged in a periodic fashion. If the periodic arrangement exists throughout the entire solid, the substance is defined as being formed of a single crystal. If the solid is composed of a myriad of single crystal regions, the solid is referred to as polycrystalline material. The periodic arrangement of atoms in a crystal is commonly called "the lattice." The crystal lattice also contains a volume which is representative of the entire lattice and is referred to as a unit cell that is regularly repeated throughout the crystal. For example, silicon has a diamond cubic lattice structure, which can be represented as two interpenetrating face-centered cubic lattices. Thus, the simplicity of analyzing and visualizing cubic lattices can be extended to the characterization of silicon crystals. In the description herein, references to various planes in silicon crystals, or crystals of other semiconductor materials, will be made, especially to the (100), (110), and (111) crystallographic planes. These planes define the orientation of the plane of silicon atoms relative to the principle crystalline axes. The numbers (xyz) are referred to as Miller indices and are determined from the reciprocals of the points at which the crystal plane of silicon intersects the principal crystalline axes. In FIG. 1A, the crystal plane of silicon intersects the x-axis at 1 and does not intersect the y-axis or z-axis. Therefore, the orientation of this type of crystalline silicon is denoted as (100). Similarly, FIG. 1B shows (110) crystalline silicon and FIG. 1C shows (111) crystalline silicon.

Figure 2A:
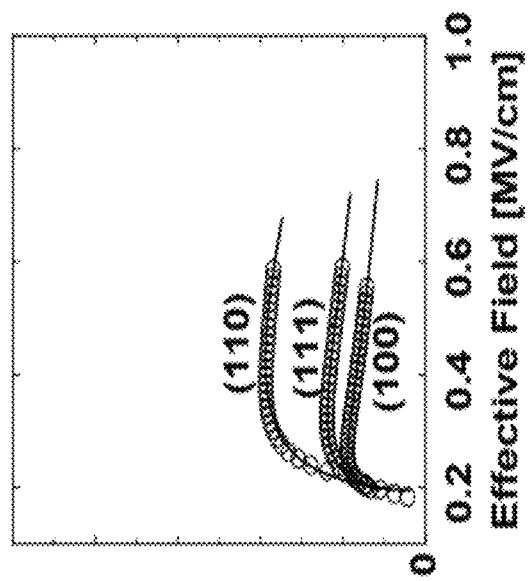
FIGS. 2A and 2B show comparison charts of electron mobility and hole mobility under different crystallographic planes.
Figure 2B:
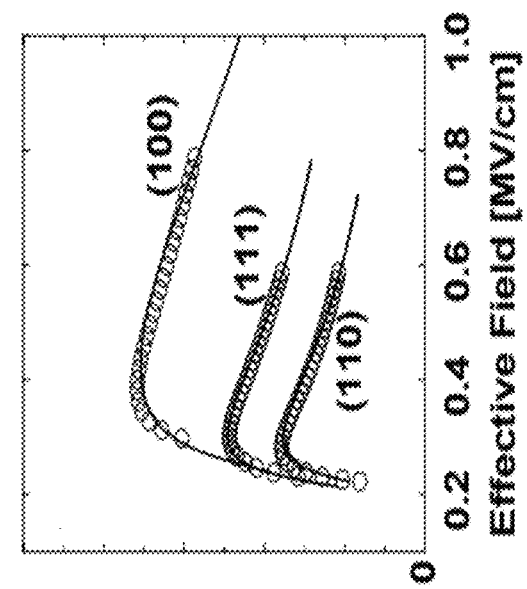

Electrons (for n-type transistors) and Holes (for p-type transistors) exhibit different mobilities in different crystallographic planes. Referring to FIG. 2A, electrons have the highest mobility in the (100) plane and the lowest mobility in the (110) plane, with the mobility in the (111) plane therebetween. Referring to FIG. 2B, on the contrary, the (110) plane provides the highest mobility for holes, while the (100) plane provides the lowest mobility, with the mobility in the (111) plane therebetween. An n-type GAA transistor with increased surface area of (100) plane in the channel will have better conductive performance; and a p-type GAA transistor with increased surface area of (110) plane in the channel will have better conductive performance. But in a conventional GAA process flow for forming complementary metal-oxide-semiconductor (CMOS) transistors, an increase of surface area comprising a (100) plane, which benefits n-type transistors, often comes with a tradeoff of a decrease of surface area comprising a (110) plane. Therefore, p-type transistors may not benefit as much as n-type transistors from GAA structures.

An object of the present disclosure is to devise a CMOS formation flow so as to combine the (100) and (110) planes to obtain a higher mobility for holes to enhance p-type FETs performance, without sacrificing (100) planes which benefits n-type FETs. In the present disclosure, intermediate stages of forming the FETs are illustrated. Variations of the embodiments are discussed. It is appreciated that although FIGS. 4-17 illustrate formation of a p-type FET and an n-type FET for illustrative purposes, wherein the p-type FET exhibits a fin-like structure and a multi-gate gate electrode and the n-type FET exhibits nanowire-like structures with a GAA gate electrode, these examples are provided for illustrative purposes only and one of ordinary skill in the art would realize that the n-type FET may utilize a fin-like structure and the p-type FET may utilize nanowire-like structures when using different materials. It should also be appreciated that the various embodiments illustrated in FIGS. 16A-16D illustrate single structures for illustrative purposes and that the various n-type and p-type structures disclosed herein may be combined to form devices designed with various types of materials and operating characteristics.

Figure 3A:
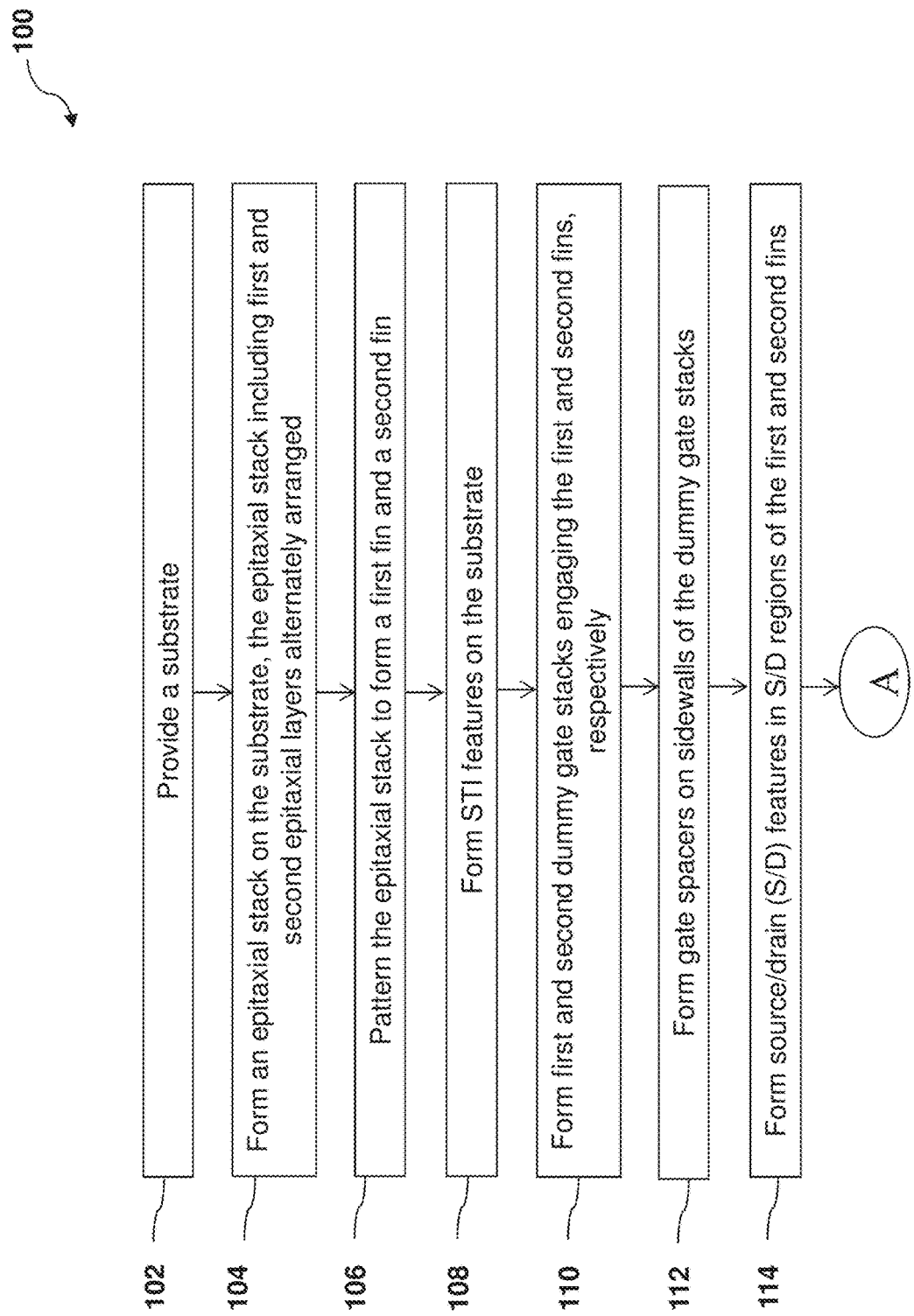
FIGS. 3A and 3B show a flow chart of a method for forming a nanosheet device, according to one or more aspects of the present disclosure.
Figure 3B:
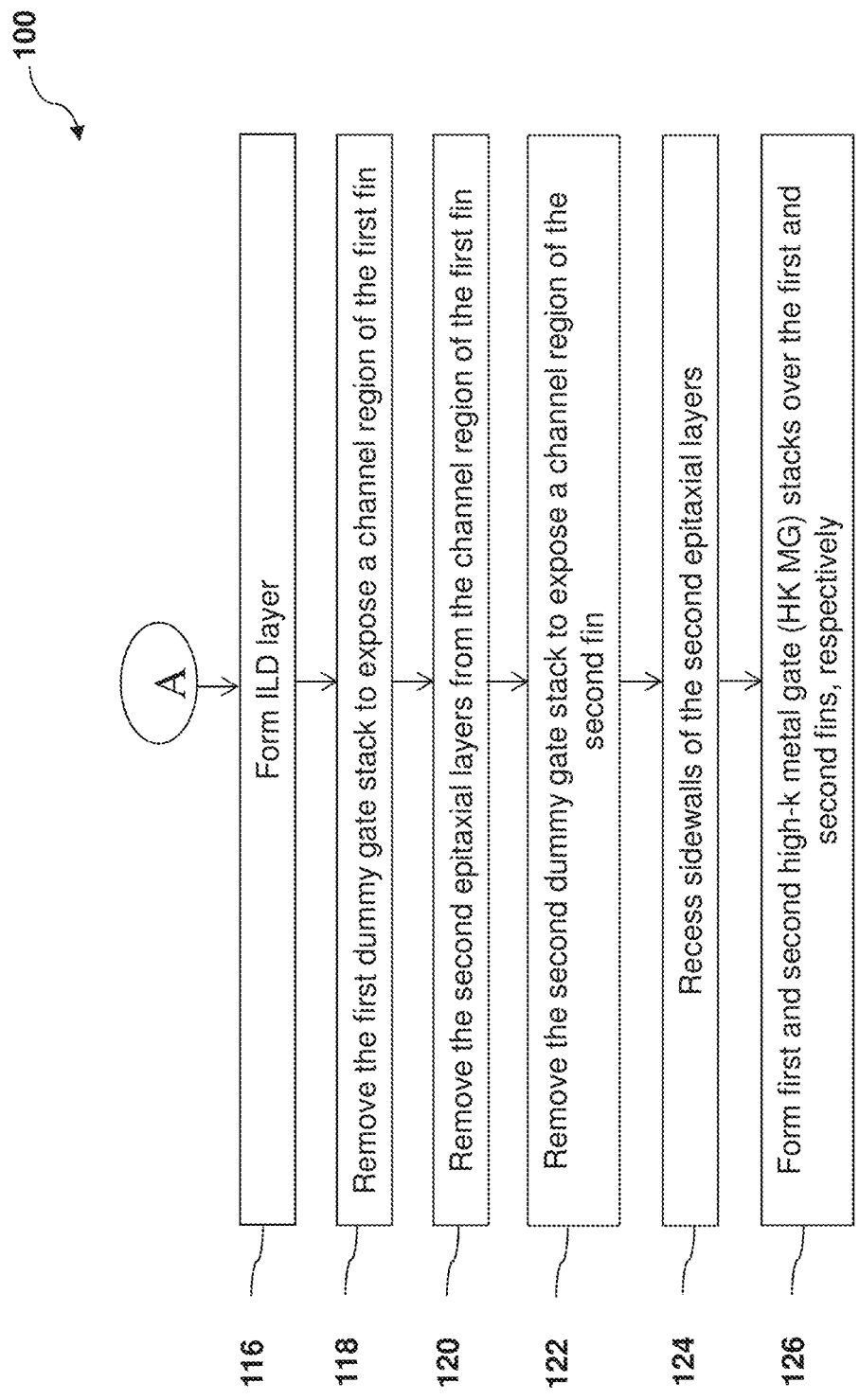

Illustrated in FIGS. 3A and 3B is a method 100 of semiconductor fabrication including fabrication of FinFETs with nanosheet structures. Referring to FIG. 3A, the method 100 begins at block 102 where a substrate is provided. Referring to the example of FIG. 4, in an embodiment of block 102, a substrate 202 is provided. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. For example, different doping profiles (e.g., n wells, p wells) may be formed on the substrate 202 in regions designed for different device types (e.g., n-type and p-type FETs) with suitable dopants (e.g., phosphorus, arsenic, boron, indium, or combinations thereof). The suitable doping may include ion implantation of dopants and/or diffusion processes. The substrate 202 may have isolation features (e.g., shallow trench isolation (STI) features) interposing the regions providing different device types. The substrate 202 may also include other semiconductors such as germanium, silicon carbide (SiC), silicon germanium (SiGe), or diamond. Alternatively, the substrate 202 may include a compound semiconductor and/ or an alloy semiconductor. Further, the substrate 202 may optionally include an epitaxial layer (epi-layer), may be strained for performance enhancement, may include a silicon-on-insulator (SOI) structure, and/or have other suitable enhancement features.

In an embodiment of the method 100, in block 102, an anti-punch through (APT) implant is performed. The APT implant may be performed in a region underlying the channel region of a device for example, to prevent punch-through or unwanted diffusion.

Returning to FIG. 3A, the method 100 then proceeds to block 104 where one or more epitaxial layers are grown on the substrate. With reference to the example of FIG. 4, in an embodiment of block 104, an epitaxial stack 204 is formed over the substrate 202. The epitaxial stack 204 includes epitaxial layers 206 of a first composition interposed by epitaxial layers 208 of a second composition. The first and second composition can be different. In an embodiment, the epitaxial layers 208 are SiGe and the epitaxial layers 206 are silicon (Si). The Ge may have a molar concentration in SiGe from about 5% to about 30%, such as from about 20% to about 25% in a specific example. However, other embodiments are possible including those that provide for a first composition and a second composition having different oxidation rates and/or etch selectivity. In some embodiments, either of the epitaxial layers 206 and 208 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. In some embodiments, the epitaxial layer 206 includes GaAs and the epitaxial layer 208 includes SiGe. In some embodiments, the epitaxial layer 206 includes GaAs and the epitaxial layer 208 includes Si. In some embodiments, the epitaxial layer 206 includes InGaAs and the epitaxial layer 208 includes SiGe.

In the illustrated embodiment, a top surface $S_1$ of the epitaxial stack 204 is a (100) plane and a sidewall surface $S_2$ of the epitaxial stack 204 is a (110) plane. In some alternative embodiments, the sidewall surface $S_2$ is a (111) plane. Portions of the epitaxial layers 206 or 208, or a combination thereof, will form nanosheet channel(s) of the CMOS device 200. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section.

Figure 4:
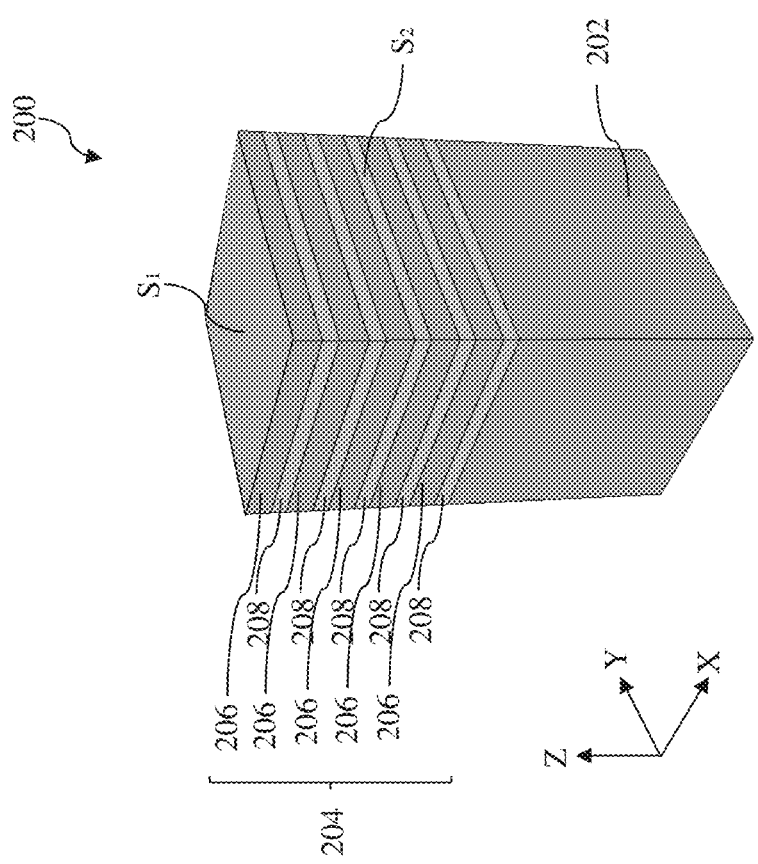
FIGS. 4, 5, and 6 illustrate perspective views of a semiconductor structure during a fabrication process according to the method of FIGS. 3A and 3B, according to aspects of the present disclosure.
Figure 5:
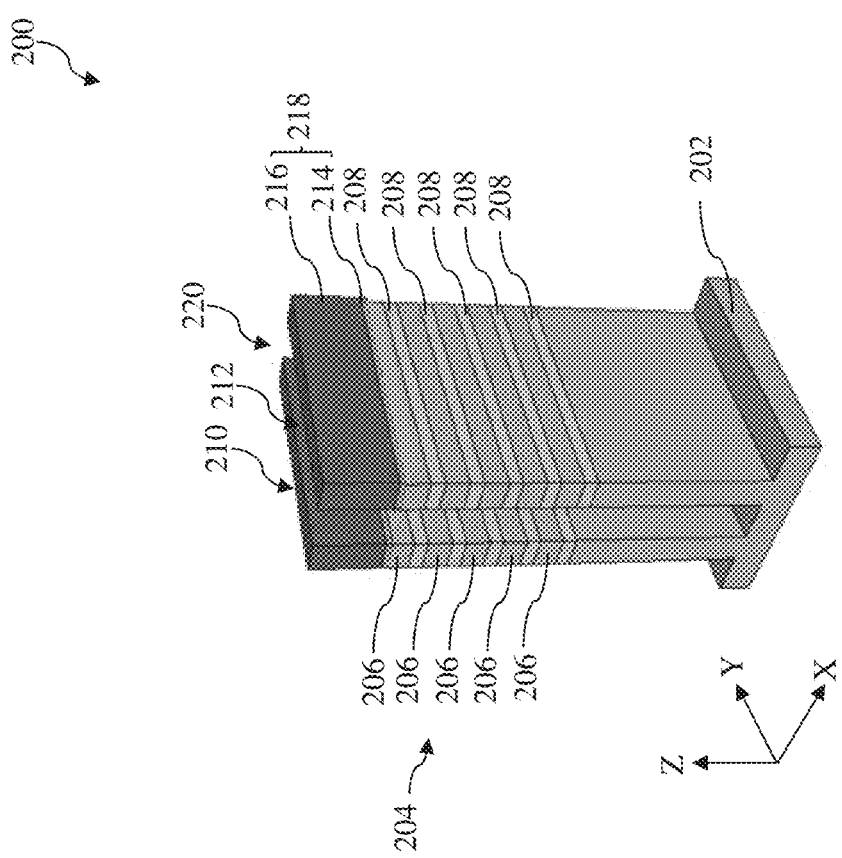

It is noted that five (5) layers of the epitaxial layers 206 and five (5) layers of the epitaxial layers 208 are alternately arranged as illustrated in FIG. 4, which is for illustrative purposes only and not intended to be limiting beyond what is specifically recited in the claims. It can be appreciated that any number of epitaxial layers can be formed in the epitaxial stack 204; the number of layers depending on the desired number of channels regions for the device 200. In some embodiments, the number of either the epitaxial layers 206 or 208 is at least 4.

In some embodiments, each epitaxial layer 206 has a thickness range of about 3-5 nanometers (nm). The epitaxial layers 206 may be substantially uniform in thickness. In some embodiments, each epitaxial layer 208 has a thickness range of about 3-5 nm. In some embodiments, the epitaxial layers 208 of the stack are substantially uniform in thickness. In some embodiments, the epitaxial layer 206 has a thickness larger than the epitaxial layer 208, such as 5 nm for the epitaxial layer 206 and 3 nm for the epitaxial layer 208 in a specific example. As described in more detail below, in a subsequently-formed n-type FinFET, the epitaxial layers 206 serve as nanowire channels and epitaxial layers 208 serve to define a gap distance between adjacent nanowire channels; in a subsequently-formed p-type FinFET, the epitaxial layers 206 and 208 jointly serve as channels, with their respective thicknesses chosen based on device performance considerations.

By way of example, epitaxial growth of the layers of the stack 204 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 206 include the same material as the substrate 202. In some embodiments, the epitaxially grown layers 206 and 208 include a different material than the substrate 202. As stated above, in at least some examples, the epitaxial layers 208 includes epitaxially grown silicon germanium (SiGe) and the epitaxial layers 206 includes epitaxially grown silicon (Si). As discussed, the materials of the epitaxial layers 206 and 208 may be chosen based on providing differing oxidation, etch selectivity properties. In various embodiments, the epitaxial layers 206 and 208 are substantially dopant-free (i.e., having an extrinsic dopant concentration from about $0$ $cm^{-3}$ to about $1\times10^{17}$ $cm^{-3}$), where for example, no intentional doping is performed during the epitaxial growth process.

The method 100 then proceeds to block 106 where fin elements (referred to as fins) are patterned and formed. With reference to the example of FIG. 5, in an embodiment of block 106, a first fin 210 and a second fin 212 extending from the substrate 202 are formed. The number of fins is for illustrative purposes only and not intended to be limiting beyond what is specifically recited in the claims. It can be appreciated that any number of fins can be formed depending on the desired number of transistors to be formed in the process. In the illustrated embodiment, the fins 210 and 212 are spaced apart along the X-direction, and each of them extends lengthwise along the Y-direction.

In various embodiments, each of the fins includes a substrate portion formed from the substrate 202 and portions of each of the epitaxial layers of the epitaxial stack 204 including epitaxial layers 206 and 208. The fins 210 and 212 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 210 and 212 by etching initial epitaxial stack 204. The etching process can include dry etching, wet etching, reactive ion etching (RIE), and/or other suitable processes.

In the illustrated embodiment, a hard mask (HM) layer 218 is formed over the epitaxial stack 204 prior to patterning the fins. In some embodiments, the HM layer 218 includes an oxide layer 214 (e.g., a pad oxide layer that may include $SiO_2$) and a nitride layer 216 (e.g., a pad nitride layer that may include $Si_3N_4$) formed over the oxide layer 214. The oxide layer 214 may act as an adhesion layer between the epitaxial stack 204 and the nitride layer 216 and may act as an etch stop layer for etching the nitride layer 216. In some examples, the HM layer 218 includes thermally grown oxide, chemical vapor deposition (CVD)-deposited oxide, and/or atomic layer deposition (ALD)-deposited oxide. In some embodiments, the HM layer 218 includes a nitride layer deposited by CVD and/or other suitable techniques.

The fins 210 and 212 may subsequently be patterned using suitable processes including photolithography and etch processes. The photolithography process may include forming a photoresist layer (not shown) over the HM layer 218, exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 202, and layers formed thereupon, while an etch process forms trenches 220 in unprotected regions through the HM layer 212, through the epitaxial stack 204, and into the substrate 202, thereby leaving the plurality of extending fins 210 and 212. The trenches 220 may be etched using a dry etch (e.g., reactive ion etching), a wet etch, and/or combination thereof.

Numerous other embodiments of methods to form the fins on the substrate may also be used including, for example, defining the fin region (e.g., by mask or isolation regions) and epitaxially growing the epitaxial stack 204 in the form of the fins. In some embodiments, forming the fins may further include a trim process to decrease the width of the fins. The trim process may include wet and/or dry etching processes.

Figure 6:
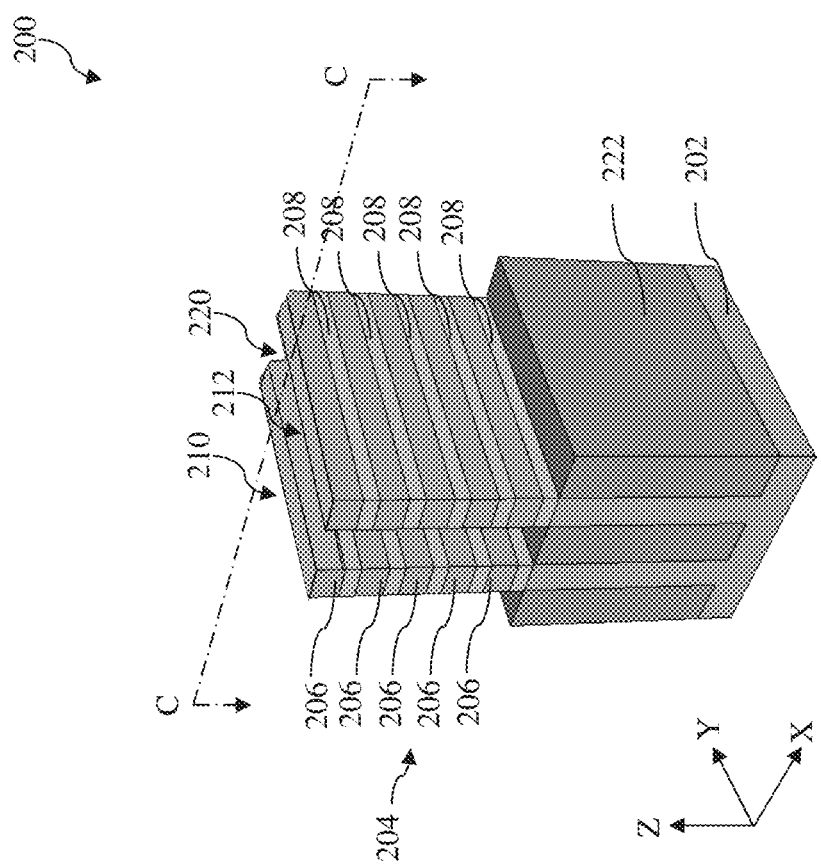

Referring to FIGS. 3A and 6, method 100 proceeds to block 108 by forming shallow trench isolation (STI) features 222 interposing the fins 210 and 212. By way of example, in some embodiments, a dielectric layer is first deposited over the substrate 202, filling the trenches 220 with the dielectric material. In some embodiments, the dielectric layer may include $SiO_2$, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable process. In some embodiments, after deposition of the dielectric layer, the device 200 may be annealed, for example, to improve the quality of the dielectric layer. In some embodiments, the dielectric layer (and subsequently formed STI features 222) may include a multi-layer structure, for example, having one or more liner layers.

In some embodiments of forming the isolation (STI) features, after deposition of the dielectric layer, the deposited dielectric material is thinned and planarized, for example by a chemical mechanical polishing (CMP) process. In some embodiments, the HM layer 218 (FIG. 5) functions as a CMP stop layer. The STI features 222 interposing the fins 210 and 212 are recessed. Referring to the example of FIG. 6, the STI features 222 are recessed providing the fins 210 and 212 extending above the STI features 222. In some embodiments, the recessing process may include a dry etching process, a wet etching process, and/or a combination thereof. The HM layer 218 may also be removed before, during, and/or after the recessing of the STI features 222. The HM layer 218 may be removed, for example, by a wet etching process using $H_3PO_4$ or other suitable etchants. In some embodiments, the HM layer 218 is removed by the same etchant used to recess the STI features 222. In some embodiments, a recessing depth is controlled (e.g., by controlling an etching time) so as to result in a desired height of the exposed upper portion of the fins. In the illustrated embodiment, the desired height exposes each of the layers of the epitaxial stack 204.

The method 100 then proceeds to block 110 where sacrificial layers/features are formed and in particular, dummy gate stacks. While the present discussion is directed to a replacement gate process whereby dummy gate stacks are formed and subsequently replaced, other configurations may be possible.

Figure 7:
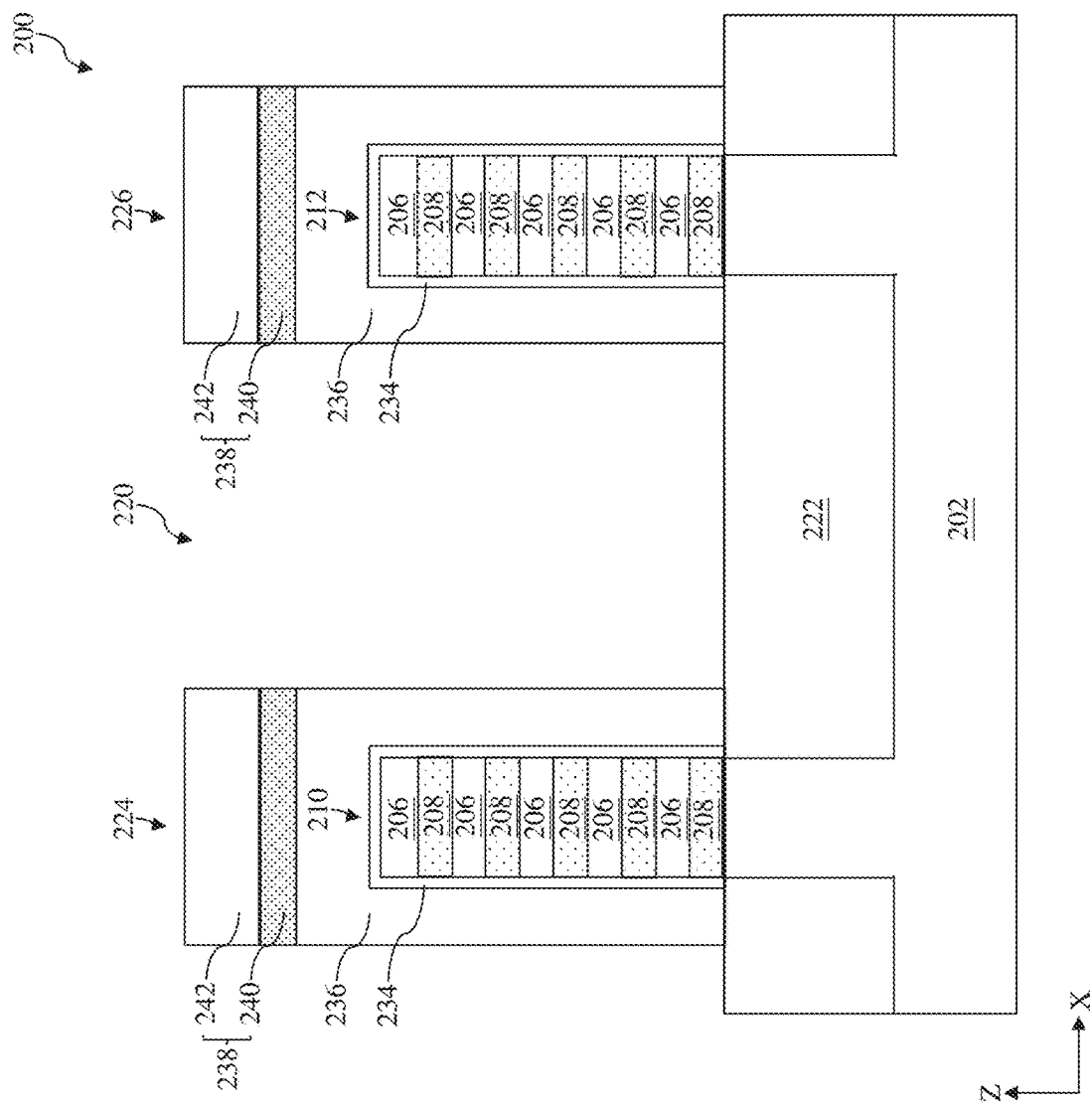

With reference to FIG. 7, which is a cross-sectional view of XZ plane along a C-C line in FIG. 6, a first gate stack 224 and a second gate stack 226 are formed, engaging the first fin 210 and the second fin 212, respectively. In some embodiments using a gate-last process, the gate stacks 224 and 226 are dummy gate stacks and will be replaced by final gate stacks at a subsequent processing stage of the device 200. Therefore, the gate stacks 224 and 226 are also referred to as the dummy gate stacks 224 and 226. In particular, each of the dummy gate stacks 224 and 226 may be replaced at a later processing stage by a high-K dielectric layer (HK) and metal gate electrode (MG) as discussed below. The dummy gate stacks 224 and 226 are at least partially disposed over the fins 210 and 212, respectively. The portion of the fins underlying the dummy gate stacks may be referred to as a channel region. As will be shown below, in the illustrated embodiments, the first fin 210 provides a channel region for an n-type FET and the second fin 212 provides a channel region for a p-type FET. The dummy gate stacks also define source/drain (S/D) regions of the fins, for example, the regions of each fin adjacent and on opposing sides of the channel region.

In the illustrated embodiment, block 110 first forms a dummy dielectric layer 234 over the fins 210 and 212. In some embodiments, the dummy dielectric layer 234 may include $SiO_2$, silicon nitride, a high-K dielectric material and/or other suitable material. In various examples, the dummy dielectric layer 234 may be deposited by a CVD process, a subatmospheric CVD (SACVD) process, a flowable CVD process, an ALD process, a PVD process, or other suitable process. By way of example, the dummy dielectric layer 234 may be used to prevent damages to the fins 210 and 212 by subsequent processing (e.g., subsequent formation of the dummy gate stack). Subsequently, block 110 forms other portions of the dummy gate stacks, including a dummy electrode layer 236 and a hard mask 238 which may include multiple layers 240 and 242 (e.g., an oxide layer 240 and a nitride layer 242). In some embodiments, the dummy gate stacks 224 and 226 are formed by various process steps such as layer deposition, patterning, etching, as well as other suitable processing steps. Exemplary layer deposition processes includes CVD (including both low-pressure CVD and plasma-enhanced CVD), PVD, ALD, thermal oxidation, e-beam evaporation, or other suitable deposition techniques, or combinations thereof. In forming the gate stack for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the dummy electrode layer 236 may include polycrystalline silicon (polysilicon). In some embodiments, the hard mask 238 includes an oxide layer 240 such as a pad oxide layer that may include $SiO_2$. In some embodiments, hard mask 238 includes the nitride layer 242 such as a pad nitride layer that may include $Si_3N_4$, silicon oxynitride and/or silicon carbide.

Figure 8:
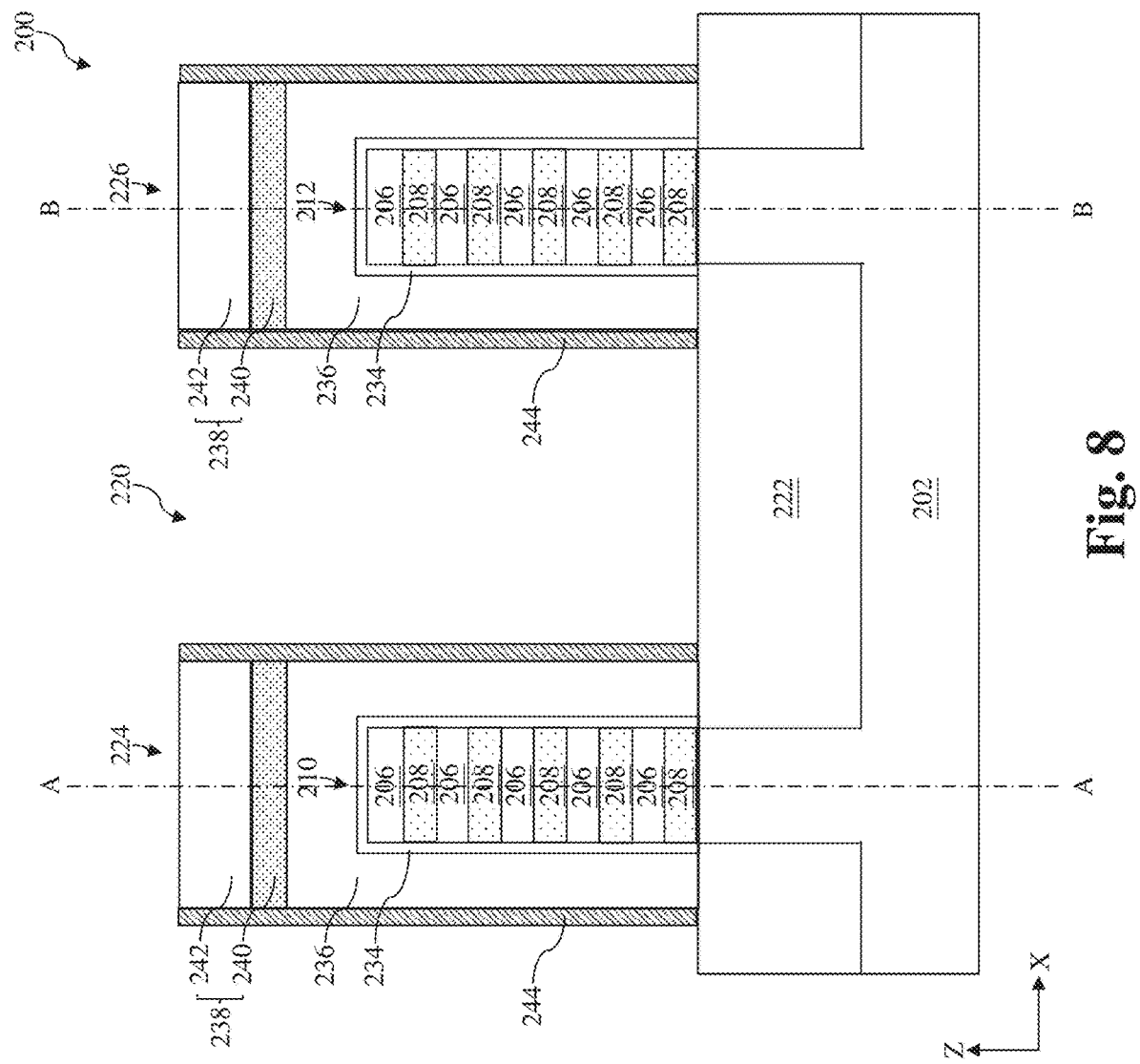

Referring to FIGS. 3A and 8, the method 100 then proceeds to block 112 where a spacer material layer is deposited on the substrate. The spacer material layer may be a conformal layer that is subsequently etched back to form sidewall spacers. In the illustrated embodiment, a spacer material layer 244 is disposed conformally on top and sidewalls of the dummy gate stacks 224 and 226. The spacer material layer 244 may include a dielectric material such as silicon oxide, silicon nitride, silicon carbide, silicon oxynitride, SiCN films, silicon oxycarbide, SiOCN films, and/or combinations thereof. In some embodiments, the spacer material layer 244 includes multiple layers, such as main spacer walls, liner layers, and the like. By way of example, the spacer material layer 244 may be formed by depositing a dielectric material over the dummy gate stacks 224 and 226 using processes such as, CVD process, a subatmospheric CVD (SACVD) process, a flowable CVD process, an ALD process, a PVD process, or other suitable process. It is noted that in the illustrated embodiment the spacer material layer 244 also conformally covers sidewalls of the fins 210 and 212 in the exposed S/D regions, for example, in an ALD process, and partially fills the trench 220 between adjacent fins. The block 112 may subsequently perform an anisotropic etching process to expose portions of the fins 210 and 212 adjacent to and not covered by the dummy gate stacks 224 and 226 (e.g., in S/D regions). Portions of the spacer material layer covering top surfaces of the hard mask 238 and STI features 222 may be completely removed by this anisotropic etching process. Portions of the spacer material layer on sidewalls of the dummy gate stacks 224 and 226 may remain, forming gate spacers, which is denoted as the gate spacers 244, for the sake of simplicity.

Referring to FIGS. 1A and 9A-10B, the method 100 then proceeds to block 114 where epitaxial S/D features are formed on exposed portions of the first fin 210 and the second fin 212, respectively, along opposing sides of the dummy gate stacks 224 and 226 in accordance with some embodiments. The S/D features may be formed by performing an epitaxial growth process that provides an epitaxial material on the fins in the S/D regions. During the epitaxial growth process, the dummy gates 224/226 and gate spacers 244 limit the epitaxial S/D features to the S/D regions. The materials used for the S/D regions of the first fin 210 and the S/D regions of the second fin 212 may be varied for the n-type and p-type FETs, such that one type of material is used for the n-type FETs and another type of material for the p-type FETs. For example, SiP or SiC may be used to form n-type FETs, and SiGe or Ge may be used to form p-type FETs. Other materials may be used. In embodiments in which different materials are utilized for the n-type FETs and the p-type FETs, it may be desirable to mask one (e.g., the n-type FETs) while forming the epitaxial material on the other (e.g., the p-type FETs), and repeating the process for the other.

Figure 9B:
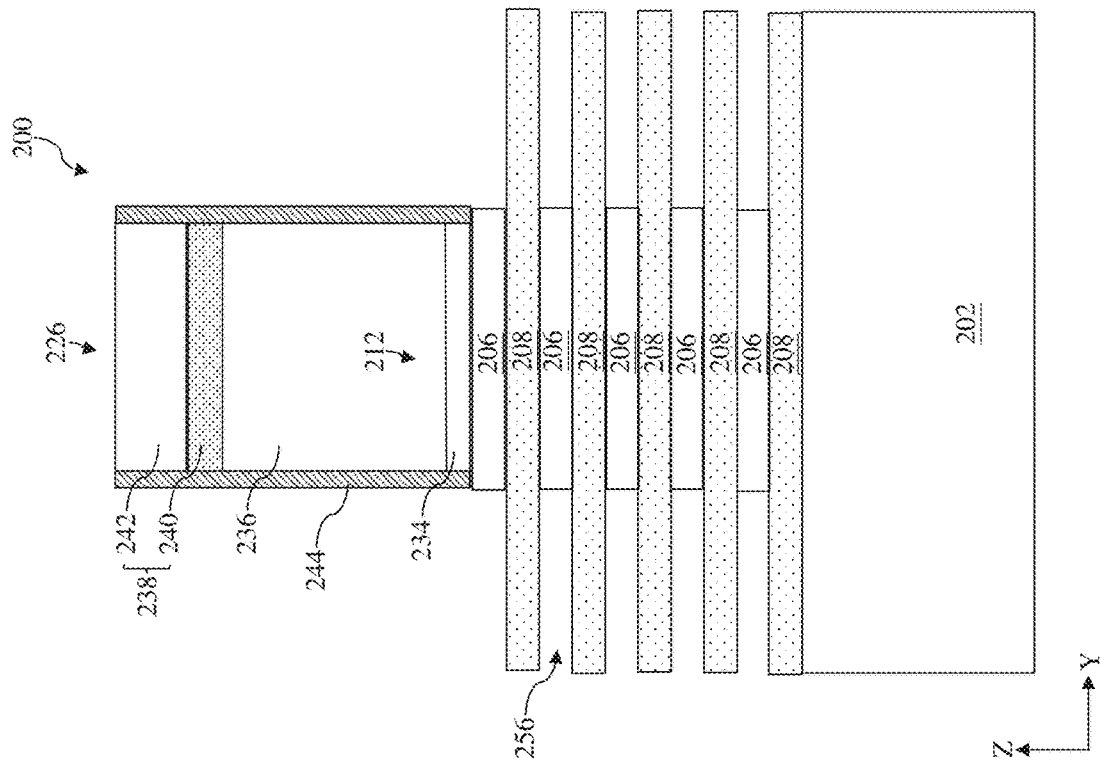
Figure 9A:
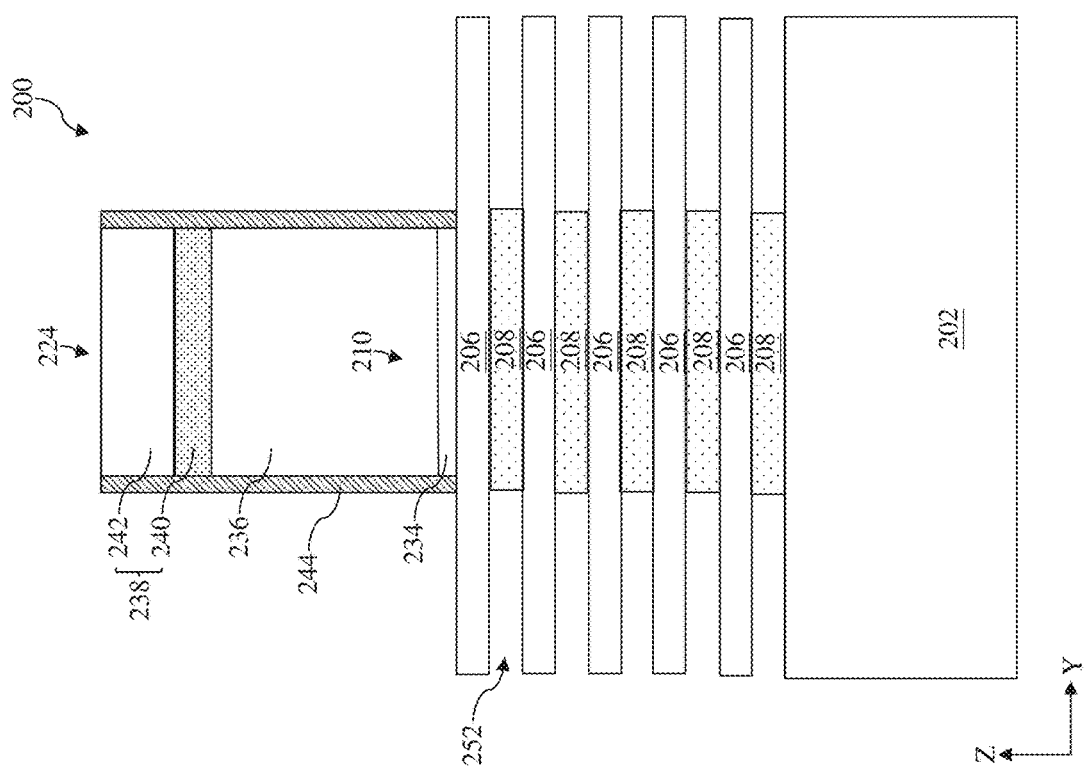

FIGS. 9A and 10A are cross-sectional views of a YZ plane along a A-A line in FIG. 8, where an n-type FET will be formed subsequently. FIGS. 9B and 10B are cross-sectional views of a YZ plane along a B-B line in FIG. 8, where a p-type FET will be formed subsequently. FIG. 9A illustrates gaps 252 in the place of the epitaxial layers 208 originally in the S/D regions of the first fin 210. The epitaxial layers 208 in the channel region remain. The gaps 252 may be filled with the ambient environment (e.g., air, $N_2$). In an embodiment, the epitaxial layers 208 are removed from the S/D regions by a selective wet etching process. In some embodiments, the selective wet etching includes an APM etch (e.g., ammonia hydroxide-hydrogen peroxide-water mixture). In some embodiments, the selective removal includes SiGe oxidation followed by a $SiGeO_x$ removal. For example, the oxidation may be provided by $O_3$ clean and then $SiGeO_x$ removed by an etchant such as $NH_4OH$. In an embodiment, the epitaxial layers 208 are SiGe and the epitaxial layers 206 are Si allowing for the selective removal of the epitaxial layers 208. It is noted that the epitaxy layers 206 (e.g., nanosheets or nanowires) may have a substantially rounded shape (e.g., cylindrical or elliptical) due to removal process of the epitaxial layers 208.

FIG. 10A illustrates forming the epitaxial S/D features 254 in the S/D regions of the first fin 210. In some embodiments, the epitaxial S/D features 254 are formed by epitaxially growing a semiconductor material surrounding each of the epitaxial layers 206 and filling the gaps 252 (FIG. 9A). Suitable epitaxial processes include CVD deposition techniques (e.g., vapor-phase epitaxy (VPE) and/or ultra-high vacuum CVD (UHV-CVD)), molecular beam epitaxy, and/or other suitable processes. In the illustrated embodiment, the surface of the substrate 202 in the S/D regions is also recessed before epitaxially growing the epitaxial S/D features 254. The epitaxial growth process may use gaseous and/or liquid precursors, which interact with the composition of the substrate 202. In one embodiment, the epitaxial layers 206 includes Si and the epitaxial S/D features 254 includes SiP or SiC.

Similar to FIG. 9A, FIG. 9B illustrates gaps 256 in the place of the epitaxial layers 206 originally in the S/D regions of the second fin 212. The epitaxial layers 206 in the channel region remain. The gaps 256 may be filled with the ambient environment (e.g., air, $N_2$). In an embodiment, the epitaxial layers 206 are removed from the S/D regions by a selective wet etching process. In an embodiment, the epitaxial layers 208 are SiGe and the epitaxial layers 206 are Si allowing for the selective removal of the epitaxial layers 206. It is noted that the epitaxial layers 208 (e.g., nanosheets or nanowires) may have a substantially rounded shape (e.g., cylindrical or elliptical) due to removal process of the epitaxial layers 206. Similar to FIG. 10A, FIG. 10B illustrates forming the epitaxial S/D features 258 in the S/D regions of the second fin 212. In some embodiments, the epitaxial S/D features 258 are formed by epitaxially growing a semiconductor material surrounding each of the epitaxial layers 208 and filling the gaps 256 (FIG. 9B). In one embodiment, the epitaxial layers 208 includes SiGe and the epitaxial S/D features 258 includes SiGe or Ge. In furtherance of the embodiment, the epitaxial layers 208 includes $Si_{1-x}Ge_x$ where x represents molar concentration ranging from about 20% to about 25%, and the epitaxial S/D features 258 includes $Si_{1-y}Ge_y$ where y represents molar concentration ranging from about 40% to about 60% and y is different from x.

In various embodiments, the epitaxial S/D features 254 and 258 may be in-situ doped during the epitaxial process by introducing doping species including: p-type dopants, such as boron or $BF_2$; n-type dopants, such as phosphorus or arsenic; and/or other suitable dopants including combinations thereof. If the epitaxial S/D features 254 and 258 are not in-situ doped, an implantation process (i.e., a junction implant process) may be performed to dope the epitaxial S/D features 254 and 258. In an exemplary embodiment, the epitaxial S/D features 254 in an n-type FET device are formed of SiC or SiP doped with phosphorus (P), and the epitaxial S/D features 258 in a p-type FET device are formed of SiGe or Ge doped with boron (B). Furthermore, silicidation or germano-silicidation may be formed on the epitaxial S/D features 254 and 258. For example, silicidation, such as nickel silicide, may be formed by depositing a metal layer over the epitaxial S/D features 254 and 258, annealing the metal layer such that the metal layer reacts with silicon in the epitaxial S/D features 254 and 258 to form the metal silicidation, and thereafter removing the non-reacted metal layer.

Figure 11:
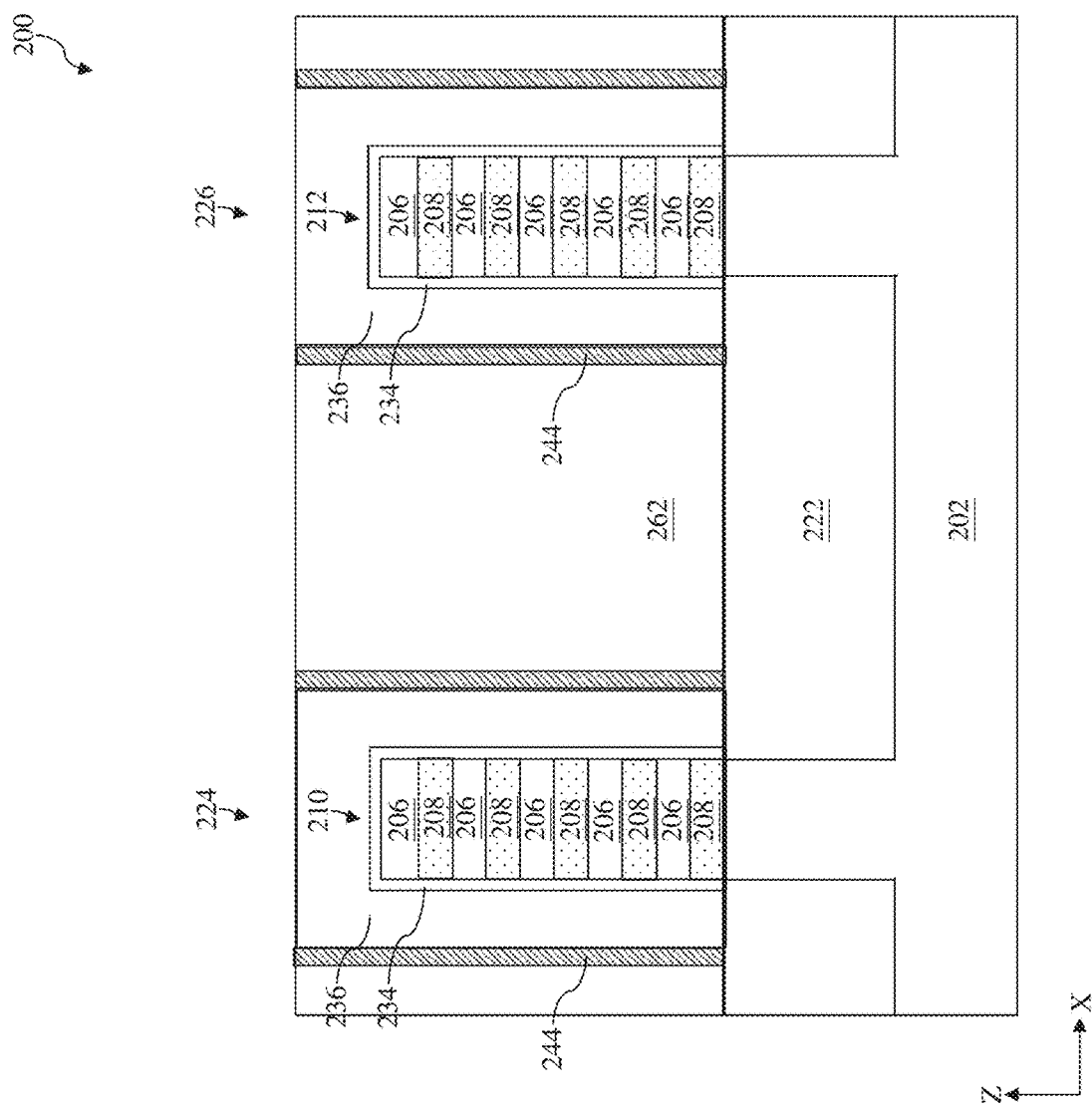

Referring to FIGS. 1B and 11, the method 100 then proceeds to block 116 where an inter-layer dielectric (ILD) layer 262 is formed on the substrate. FIG. 11 is a cross-sectional view in XZ plane cutting channel regions of the fins 210 and 212. The ILD layer 262 fills the trench 220 (FIG. 8) between the fins. In some embodiments, a contact etch stop layer (CESL) (not shown) is also formed prior to forming the ILD layer 262. In some examples, the CESL includes a silicon nitride layer, silicon oxide layer, a silicon oxynitride layer, and/or other materials known in the art. The CESL may be formed by plasma-enhanced chemical vapor deposition (PECVD) process and/or other suitable deposition or oxidation processes. In some embodiments, the ILD layer 262 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 262 may be deposited by a PECVD process or other suitable deposition technique. In some embodiments, after formation of the ILD layer 262, the semiconductor device 200 may be subject to a high thermal budget process to anneal the ILD layer.

In some examples, after depositing the ILD layer 262, a planarization process may be performed to remove excessive dielectric materials. For example, a planarization process includes a chemical mechanical planarization (CMP) process which removes portions of the ILD layer 262 (and CESL layer, if present) overlying the dummy gate stacks 224 and 226 and planarizes a top surface of the semiconductor device 200. In some embodiments, the CMP process also removes hard mask 238 (FIG. 8) and exposes the dummy electrode layer 236.

Figure 12:
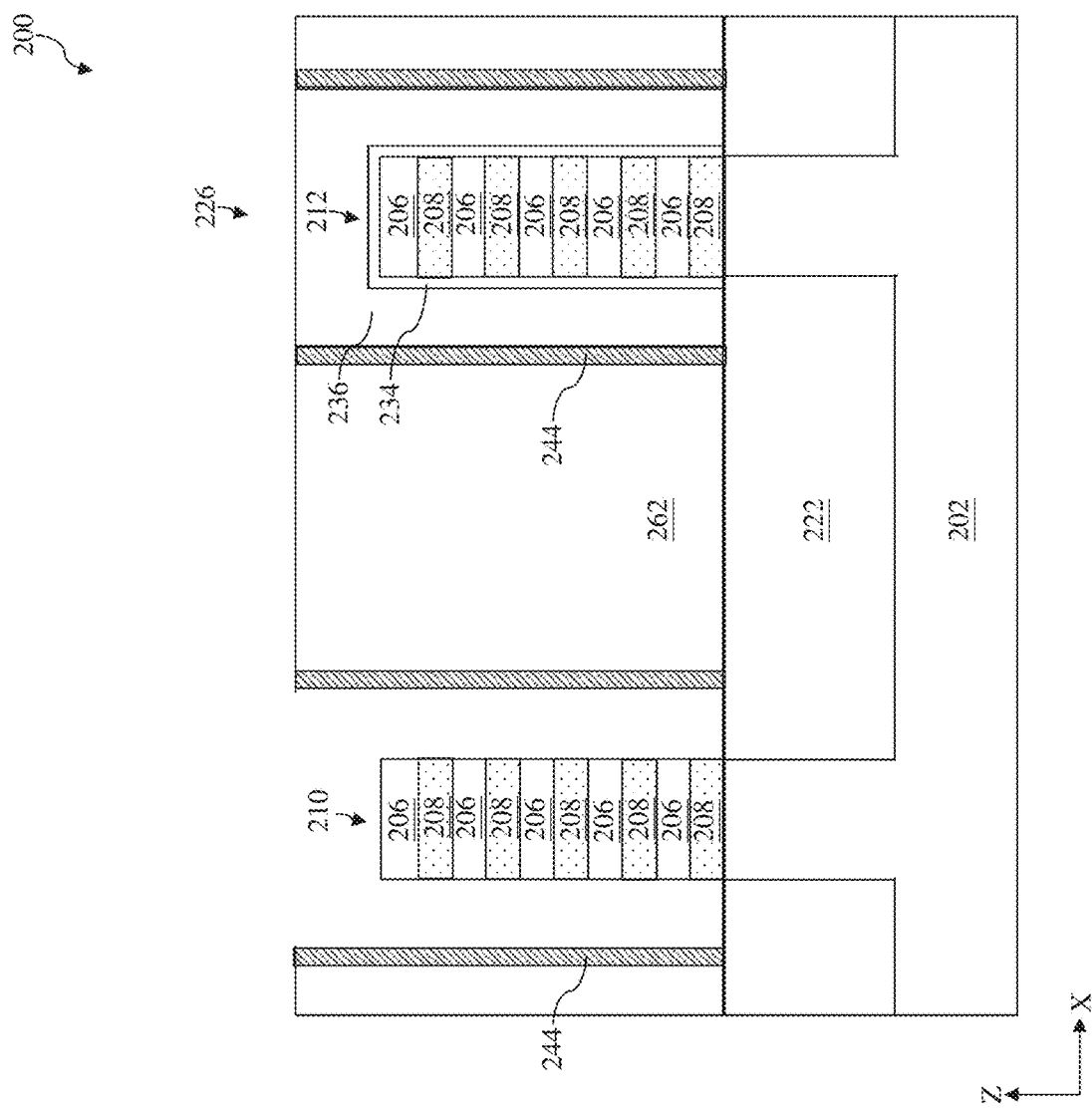

Referring to FIGS. 3B and 12, the method 100 then proceed to block 118 where an etching process is performed to remove the dummy gate stack 224 to expose the channel region of the first fin 210. Block 118 may start with depositing a patterned mask (not shown) over the gate stack 226 to protect the gate stack 226 and the second fin 212 from the subsequent etching process. As will be discussed in greater detail below, the channel regions of the first fin 210 and the second fin 212 will be processed separately. In particular, in some embodiments, the first fin 210 will form an n-type FET device with a process to remove the epitaxial layers 208, and the second fin 212 will from a p-type FET device with a process to thin or recess the epitaxial layers 208. The patterned mask may be formed of any suitable masking material exhibiting a sufficient etch selectivity to protect the underlying layers during the etch process. For example, in some embodiments, the patterned mask comprises a layer of silicon nitride. In other embodiments, the patterned mask comprises a silicon oxide layer and a silicon nitride layer over the silicon oxide layer. The patterned mask may be deposited through one or more processes such as PVD, CVD, or ALD, although any acceptable process may be utilized, and patterned using photolithography techniques.

Block 118 may further include one or more etching processes that are selective to the material in the dummy gate stack 224. For example, the removal of the dummy gate stack 224 may be performed using a selective etch process such as a selective wet etch, a selective dry etch, or a combination thereof. The epitaxial layers 206 and 208 of the fin 210 are exposed in the resulted gate trench. The opposing sidewalls the gate spacers 244 are also exposed in the gate trench. In some embodiments, the dummy electrode layer 236 is removed by an etch process that is selective to the material of the dummy electrode layer 236. For example, if the dummy electrode layer 236 comprises polysilicon, a dry etch using $NF_3$, $SF_6$, $Cl_2$, HBr, the like, or a combination thereof, or a wet etch using $NH_4OH$, tetramethylammonium hydroxide (TMAH), the like, or a combination thereof, may be used to remove the dummy electrode layer 236. In some embodiments, the dummy dielectric layer 234 is subsequently removed from along the sidewalls of the first fin 210 by an etch process that is selective to the material of the dummy dielectric layer 234. In embodiments in which the dummy dielectric layer 234 comprises silicon oxide, wet etch using a diluted HF acid may be used to remove the exposed portions of the dummy dielectric layer 234.

Figure 13:
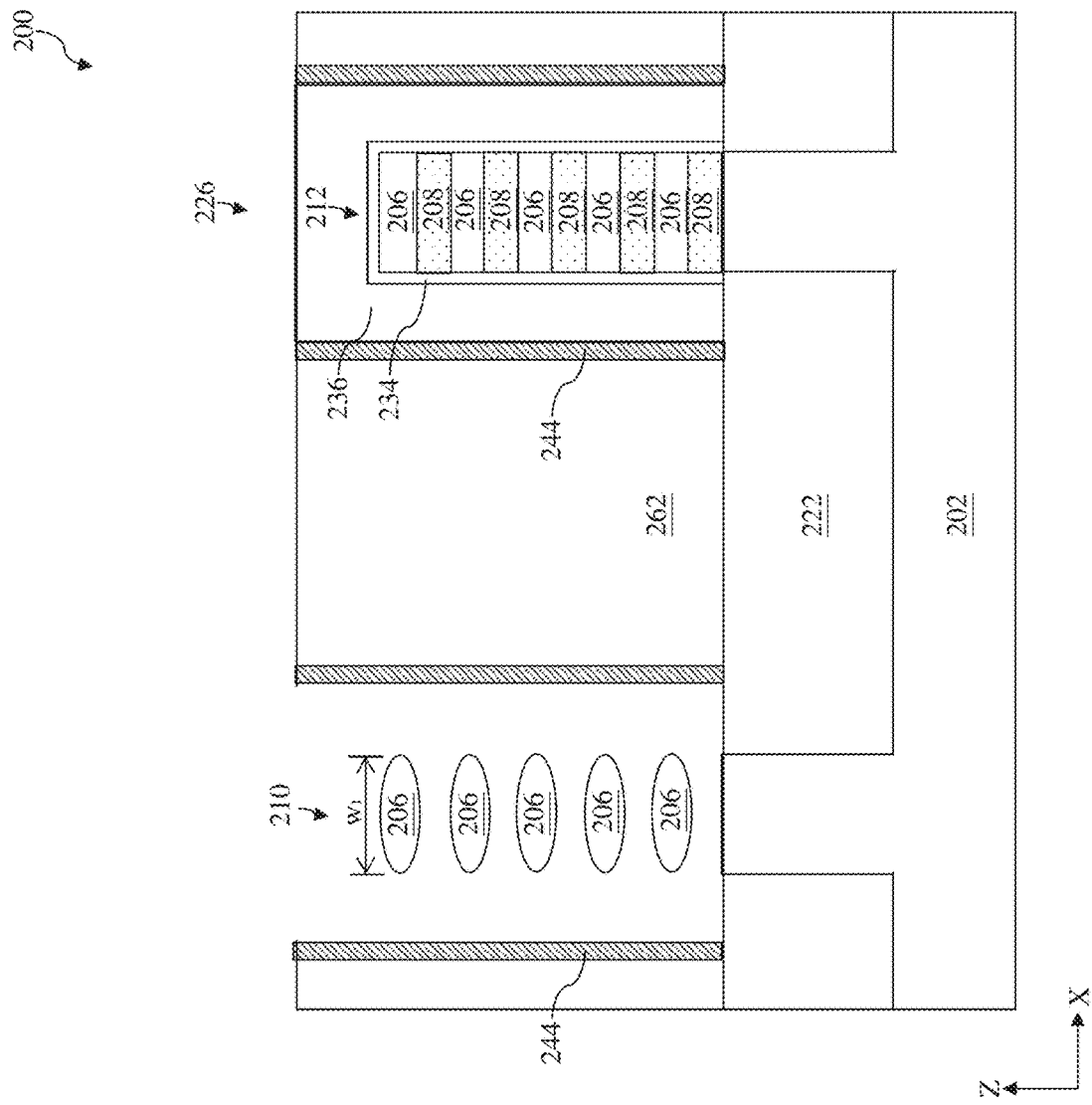

Referring to FIGS. 3B and 13, the method 100 then proceed to block 120 where an etching process is performed to remove the epitaxial layers 208 from the channel region of the first fin 210. In embodiments in which the epitaxial layers 208 are formed of silicon germanium (SiGe) and the epitaxial layers 206 are formed of silicon (Si), the epitaxial layers 208 may be removed using an etchant that etches SiGe at a higher rate than Si, such as $NH_4OH:H_2O_2:H_2O$ (ammonia peroxide mixture, APM), $H_2SO_4+H_2O_2$ (sulfuric acid peroxide mixture, SPM), or the like. In some embodiments, the etchant is a dry etchant comprising HCl gas under a reaction temperature ranging from about 20° C. to about 60° C. The dry etchant may also include $F_2$ or an inert carrier gas, such as Ar. This etching process removes the epitaxial layers 208, thereby forming the epitaxial layers 206 in a form of nanowires. Optionally, a rounding process may be performed to obtain rounded nanowires as illustrated in FIG. 13. The rounding process may be performed, for example, using a thermal oxidation process at a temperature of about 300° C. to about 700° C. in an ambient of $O_2$ and a pressure of about 0.5 torr to about 20 torr. The oxidation layer may be removed using HF or annealing in an ambient of $H_2$ at a temperature from about 250° C. to about 600° C. with a pressure from about 1 torr to about 100 torr to expose the underlying semiconductor material. In some embodiments, a width $W_1$ of the epitaxial layers 206 after rounding is from about 10 nm to about 15 nm, such as 12 nm.

Figure 14:
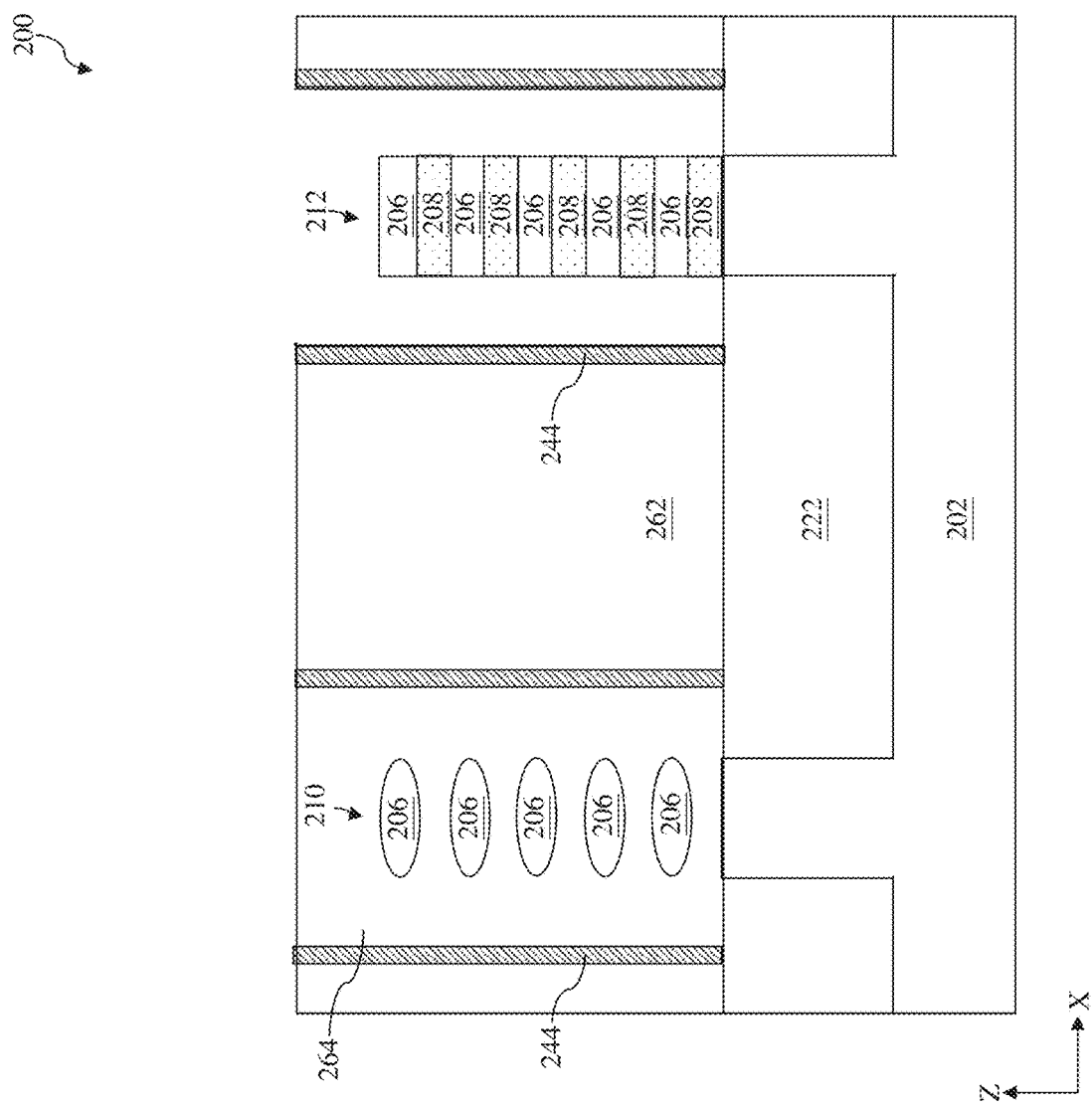

Referring to FIGS. 3B and 14, the method 100 then proceed to block 122 where an etching process is performed to remove the dummy gate stack 226 to expose the channel region of the second fin 212. In some embodiments, block 122 may include depositing a protective material 264 in the gate trench to cover the first fin 210. The protective material 264 protects the first fin 210 while processing is performed on the second fin 212. In some embodiments, the protective material 264 is silicon oxide formed through a process such as CVD, flowable CVD (FCVD), or a spin-on-glass process, although any acceptable process may be utilized. The dummy electrode layer 236 and dummy dielectric layer 234 over the second fin 212 may be removed using similar processes and etchants as the removal of the dummy electrode layer 236 and dummy dielectric layer 234 over the first fin 210 as discussed above. The removal of the dummy electrode layer 236 and dummy dielectric layer 234 from along the sidewalls of the second fin 212 exposes the epitaxial layers 206 and 208 in the resulted gate trench.

Figure 15:
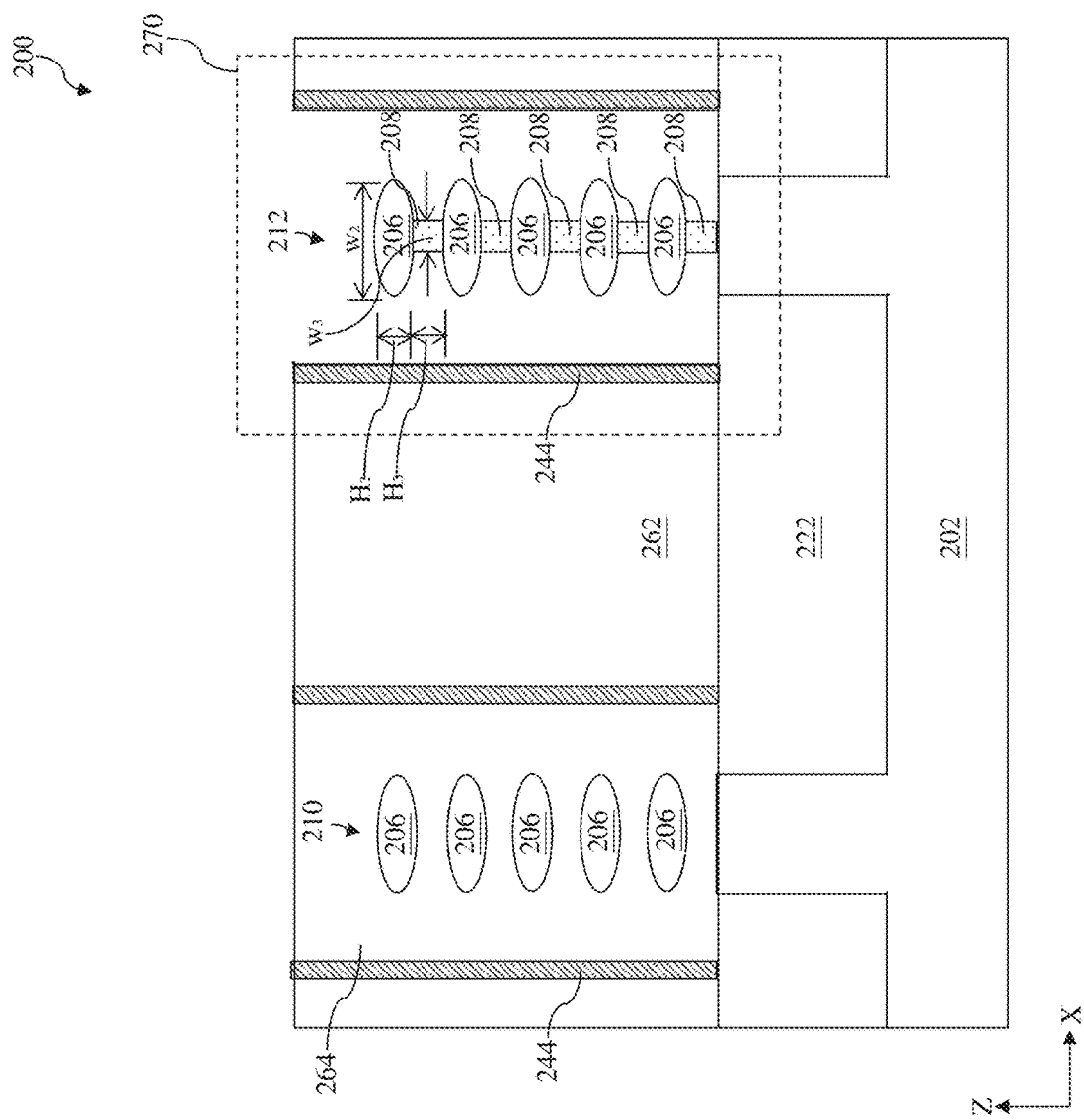

Referring to FIGS. 3B and 15, the method 100 then proceed to block 124 where sidewalls of the epitaxial layers 208 are selectively etched, recessing the epitaxial layers 208 in a lateral direction (i.e., along the X-direction). In embodiments in which the epitaxial layers 208 are formed of silicon germanium (SiGe) and the epitaxial layers 206 are formed of silicon (Si), the epitaxial layers 208 may be recessed by applying a wet etch using a tetramethylammonium hydroxide (TMAH) solution. Other processes and materials may be used, such as a dry etch process with HCl or $Cl_2$ gas at a temperature of about 540° C. to about 630° C. and under a pressure of about 5 to about 50 Torr for about 10 seconds to about 100 seconds. Optionally, a rounding process may be performed to the epitaxial layers 206 to obtain rounded nanowires as illustrated in FIG. 15, such that the epitaxial layers 206 exhibit a curvature shape (e.g., rod, circular, or elliptical) while the epitaxial layers 208 exhibit a rectangular shape in a cross-section.

A width $W_2$ of the epitaxial layers 206 and a width $W_3$ of the epitaxial layers 208 may be adjusted by controlling etching time in respective etching processes such that sufficient gate control is achieved on the second fin 212 as well as a desire hole mobility contributed from sidewalls of the epitaxial layers 208 is achieved. In some embodiments, the width $W_2$ of the epitaxial layers 206 is from about 10 nm to about 15 nm, such as about 12 nm, and the width $W_3$ of the epitaxial layers 208 is from about 2 nm to about 5 nm, such as about 3 nm. In various embodiments, the width $W_3$ of the epitaxial layers 208 is less than about one third (⅓) of the width $W_2$ of the epitaxial layers 206. Thus, the second fin 212 has a stack structure of alternating narrow and wide epitaxial layers, which is referred to as a dendrite structure. The second fin 212 may also be termed a dendrite fin. A thickness $H_2$ of the epitaxial layers 206 and a thickness $H_3$ of the epitaxial layers 208 remains substantially the same before and after respective etching processes. In some embodiments, the thickness $H_2$ of the epitaxial layers 206 is from about 3 nm to about 5 nm, such as about 5 nm, and the thickness $H_3$ of the epitaxial layers 208 is from about 3 nm to about 5 nm, such as about 3 nm. After the sidewalls of the epitaxial layers 208 are recessed, each of the epitaxial layers 208 has a narrower portion in the channel region of the second fin 212 than in the S/D regions of the second fin 212. In some embodiments, each of the epitaxial layers 208 has a dumbbell shape from a top view of the device, extending from one S/D region though the channel region to the opposing S/D region.

Compared with the epitaxial layer 206 in the first fin 210, where the nanowire contributes the full circumference to the effective gate width, the epitaxial layer 206 in the second fin 212 has less circumference to contribute to the effective gate width, with a reduction of each edge with a width $W_3$ that is directly interfacing with an adjacent epitaxial layer 208. However, the sidewalls of the epitaxial layer 208 contribute extra length to the effective gate width, which compensates the reduced circumference of the epitaxial layer 206. In some embodiments, the thickness $H_3$ is larger than the width $W_3$. Furthermore, in the illustrated embodiment, sidewalls of the epitaxial layer 208 comprise a (110) plane, while the top and bottom surfaces of the epitaxial layer 206 comprise a (100) plane. Referring back to FIG. 2B, for holes a (110) plane provides higher mobility than (111) and (100) crystallographic planes, which is opposite for electrons as illustrated in FIG. 2A, where a (110) plane provides less mobility than (100) and (111) crystallographic planes. Therefore, the dendrite structure of the fin 212, which uses holes as major carriers, gains more circumference length in a (110) plane to compensate the reduction in a (100) plane. In some alternative embodiments, sidewalls of the epitaxial layer 208 comprise a (111) plane which also has a higher hole mobility than (100) plane. Overall, the effective gate length for a p-type FET to form on the second fin 212 is increased and the hole mobility is improved. Thus, in some embodiments, even the thickness $H_3$ is less than the width $W_3$, the performance of the p-type FET is still enhanced. In various embodiments, a ratio of $H_3$:$W_3$ ranges from about 0.8:1 to about 3:1.

Figure 16A:
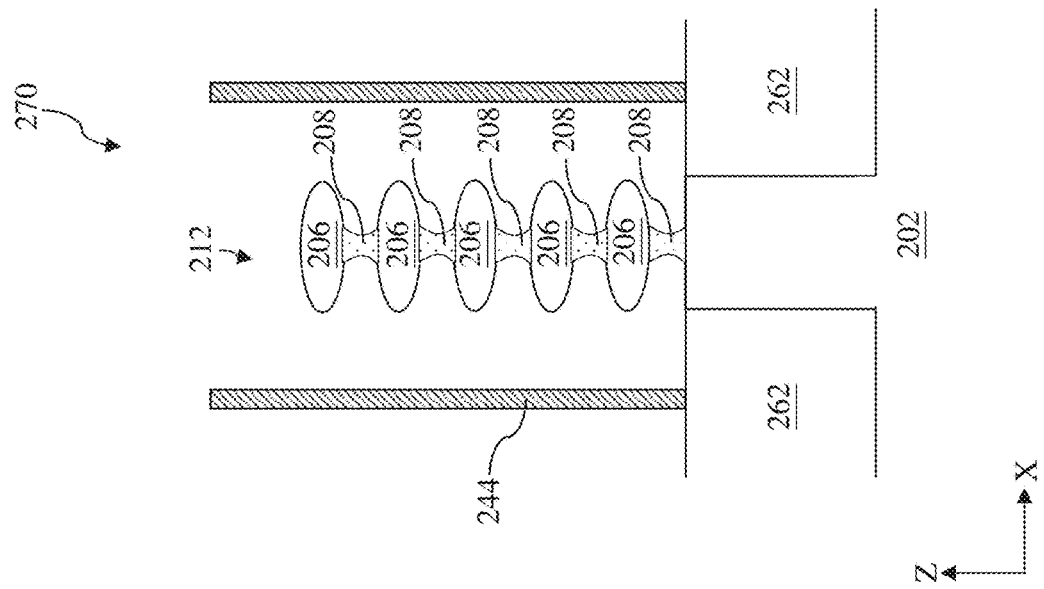
Figure 16B:
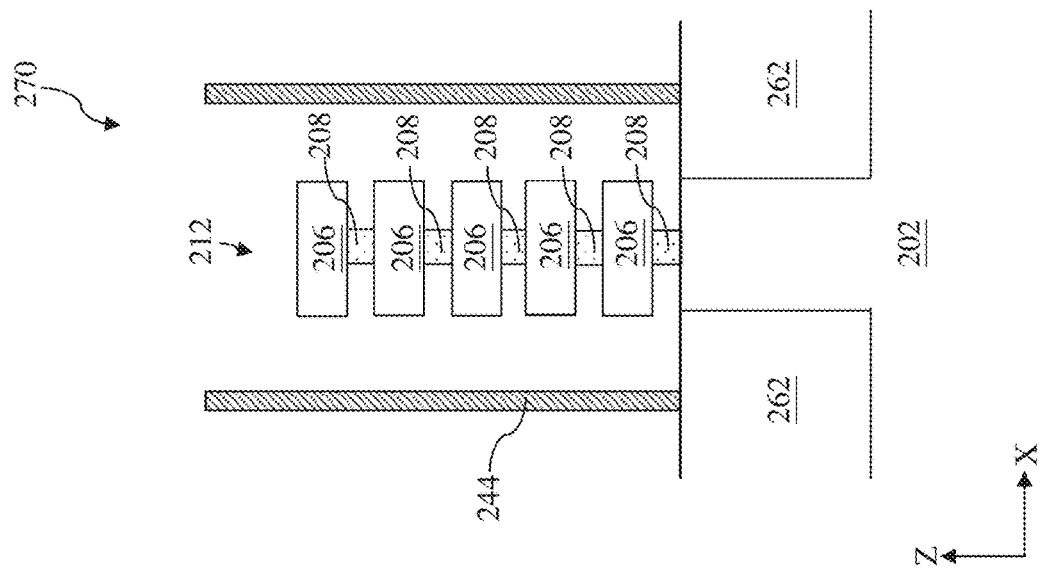
Figure 16C:
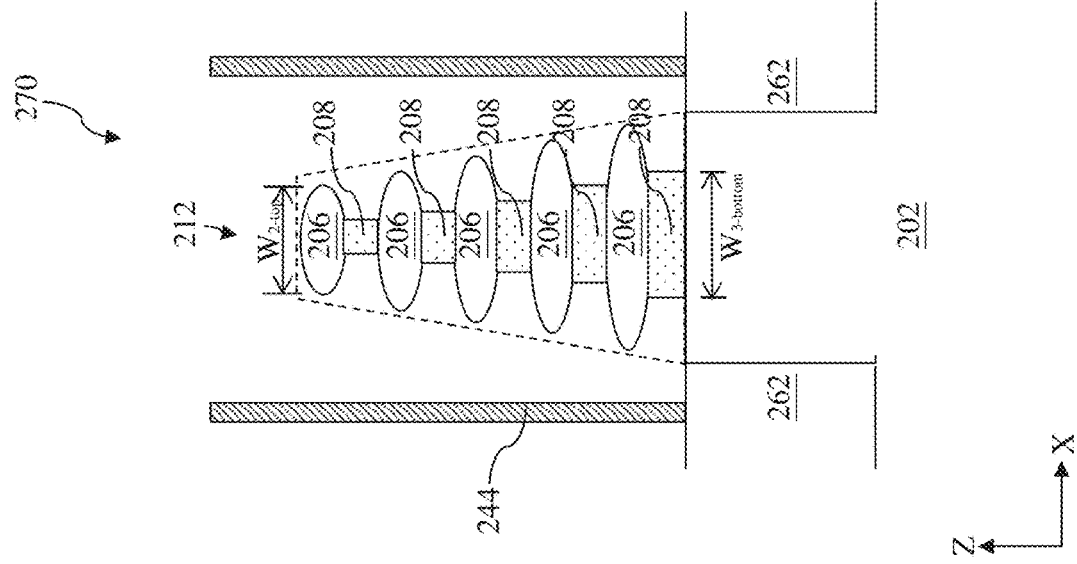
Figure 16D:
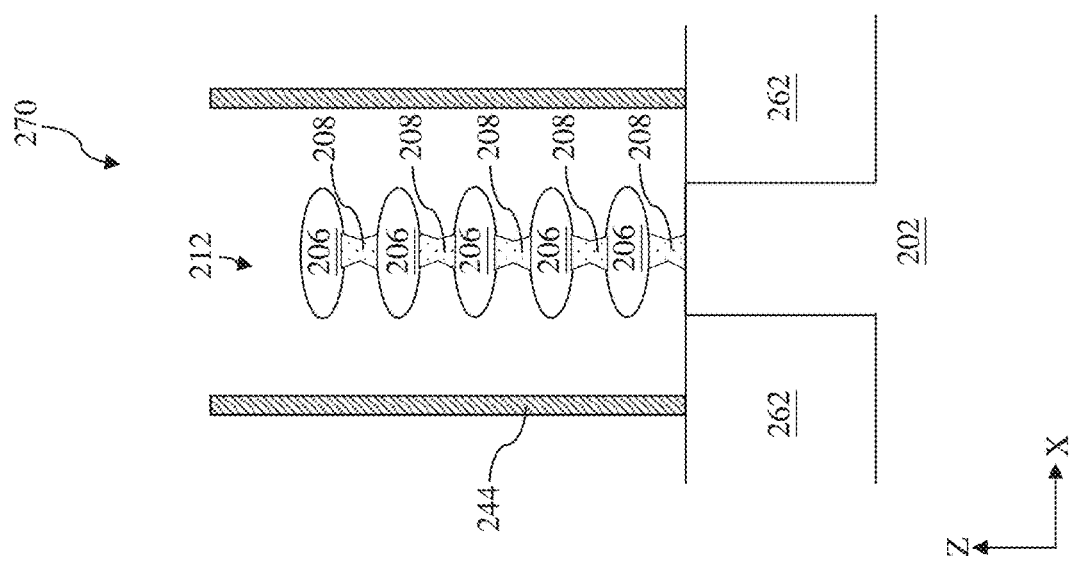

Referring to FIGS. 16A-16D, various embodiments of a dendrite fin as in a region 270 in the FIG. 15 are illustrated. In FIG. 16A, an optional rounding process towards the epitaxial layers 206 is skipped, and cross-sections of the epitaxial layers 206 and 208 both have substantially rectangular shapes. In FIG. 16B, recessing sidewalls of the epitaxial layer 208 creates a "U" shaped recess, such that sidewalls of the epitaxial layers 206 and 208 all have curvature edges but extending in opposite directions, with the curvature edges of the epitaxial layers 206 extending outwardly and the curvature edges of the epitaxial layers 208 extending inwardly. An exemplary recessing process may include performing a dry etch process with HCl or $Cl_2$ gas at a temperature of about 20° C. to about 100° C. and under a pressure of about 5 to about 50 Torr for about 10 seconds to about 100 seconds, which selectively etches the epitaxial layer 208 to provide a "U" shaped recess. In FIG. 16C, before recessing sidewalls of the epitaxial layers 208, the epitaxial layers 206 have a top surface comprising (100) plane and epitaxial layers 208 have sidewalls comprising (110) plane. An exemplary recessing process may include applying a diluted APM or SPM solution at a temperature of about 5° C. to about 50° C. for about 5 seconds to about 100 seconds which selectively etches sidewalls of the epitaxial layers 208 along a (111) plane, thereby providing a "V" shaped recess with two edges of the "V" in a (111) plane. In FIG. 16D, as marked in dotted lines, the second fin 212 may have a trapezoid shape before recessing sidewalls of the epitaxial layers 208. The trapezoid shape may be due to an etching bias during the patterning of the fin. An exemplary recessing process may include applying TMAH or $NH_4OH$ solution at a temperature of about 5° C. to about 50° C. for about 5 seconds to about 100 seconds. Consequently, after the recessing process, both the epitaxial layers 206 and the epitaxial layers 208 have a larger width in the bottom layers and a smaller width in the top layers. In a specific embodiment, a width $W_{3\text{-}bottom}$ of a lowermost epitaxial layer 208 is larger than a width $W_{2\text{-}top}$ of an uppermost epitaxial layer 206 in the channel region of the second fin 212.

Figure 17:
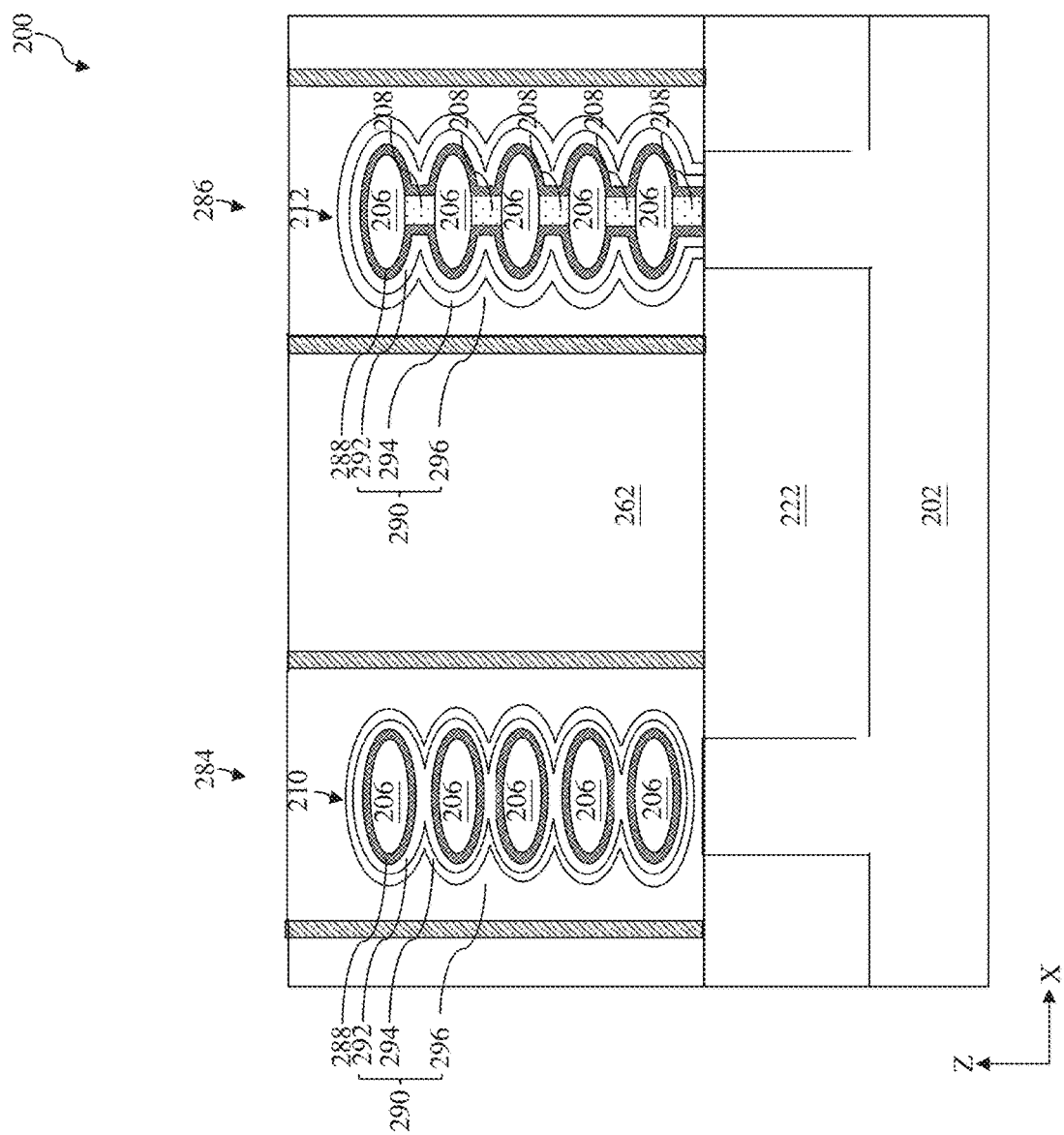

Referring to FIGS. 3B and 17, the method 100 then proceed to block 126 where gate structures 284 and 286 are formed on the fins 210 and 212, respectively. Block 126 may include first removing the protective material 264 (FIG. 15) from the channel region of the first fin 210. Each gate structure may be the gate of a multi-gate transistor. The final gate structure may be a high-K metal gate (HK MG) stack, while other compositions are possible. In some embodiments, the gate structure 284 forms the gate stack surrounding each of the multi-channels provided by the plurality of nanosheets 206 (now having gaps therebetween) in the channel region of the first fin 210, and the gate structure 286 forms the gate stack extending along sidewalls of the nanosheets 206 and 208 in the channel region of the second fin 212.

In various embodiments, each HK MG stack includes an interfacial layer (not shown), a high-K gate dielectric layer 288 formed over the interfacial layer, and a gate electrode layer 290 formed over the high-K gate dielectric layer 288. High-K gate dielectrics, as used and described herein, include dielectric materials having a high dielectric constant, for example, greater than that of thermal silicon oxide (~3.9). The conductive layer used within a HK MG gate stack may include a metal, metal alloy, or metal silicide. Additionally, the formation of the HK MG gate stack may include depositions to form various gate materials, one or more liner layers, and one or more CMP processes to remove excessive gate materials and thereby planarize a top surface of the semiconductor device 200.

In some embodiments, the interfacial layer of a gate stack may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The gate dielectric layer 288 of a gate stack may include a high-K dielectric layer such as hafnium oxide ($HfO_2$). Alternatively, the gate dielectric layer 288 of a gate stack may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba,Sr)$TiO_3$ (BST), $Al_2O_3$, $Si_3N_4$, oxynitrides (SiON), combinations thereof, or other suitable material. The high-K gate dielectric layer 288 may be formed by ALD, physical vapor deposition (PVD), CVD, oxidation, and/or other suitable methods. A thickness of the high-K gate dielectric layer 288 may range from about 10 Å to about 30 Å, such as from about 15 Å to about 25 Å in some examples.

The gate electrode layer 290 is a conductive layer that includes one or more metal layers, such as work function metal layer(s), conductive barrier layer(s), and metal fill layer(s). The gate electrode layer 290 may be formed separately for n-type FET (e.g., for fin 210) and p-type FET (e.g., for fin 212) transistors which may use different metal layers. The work function metal layer may be a p-type or an n-type work function layer. The p-type work function layer comprises a metal with a sufficiently large effective work function, selected from but not restricted to the group of titanium nitride (TiN), tantalum nitride (TaN), ruthenium (Ru), molybdenum (Mo), tungsten (W), platinum (Pt), or combinations thereof. The n-type work function layer comprises a metal with sufficiently low effective work function, selected from but not restricted to the group of titanium (Ti), aluminum (Al), tantalum carbide (TaC), tantalum carbide nitride (TaCN), tantalum silicon nitride (TaSiN), titanium silicon nitride (TiSiN), or combinations thereof. The gate electrode layer 290 may comprise multiple work function metal layers, such as the first metal layer 292 and the second metal layer 294 in the illustrated embodiment. As an example, the first metal layer 292 may include TiN, and the second metal layer 294 may include TiAl or other combinations of Ti, Ta, C, Al, such as TiAlC or TaAlC. The gate electrode layer 290 also includes a metal fill layer 296 in the illustrated embodiment. The metal fill layer 296 may include aluminum (Al), tungsten (W), cobalt (Co), and/or other suitable materials. In various embodiments, the metal layer of the gate electrode layer 290 may be formed by ALD, PVD, CVD, e-beam evaporation, or other suitable process. In various embodiments, a CMP process may be performed to remove excessive metal from the metal fill layer 296 of the gate stack, and thereby provide a substantially planar top surface.

In the illustrated embodiment, in the channel region of the p-type FET formed on the second fin 212, due to the dendrite fin, a portion of the first metal layer 292 extends along the sidewalls of the epitaxial layers 208 and is directly under the respective adjacent epitaxial layers 206. Depends on dimensions of the space between adjacent epitaxial layers 206 (as how much sidewalls of the epitaxial layers 208 are recessed), a portion of the second metal layer 294 may be directly below the epitaxial layers 206 as well. In some embodiments, a portion of the metal fill layer 296 is also directly below the epitaxial layers 206. In some alternative embodiments, the first metal layer 292 fills up the space between adjacent epitaxial layers 206, and the second metal layer 294 and the metal fill layer 296 are laterally offset (along the X-direction) from side edges of the epitaxial layers 206.

The semiconductor device 200 may undergo further processing to form various features and regions known in the art. For example, subsequent processing may form contact openings, contact metal, as well as various contacts/vias/lines and multilayers interconnect features (e.g., metal layers and interlayer dielectrics) on the substrate 202, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

Although not intended to be limiting, one or more embodiments of the present disclosure provide many benefits to a semiconductor device and the formation thereof. For example, embodiments of the present disclosure provide FinFETs with nanosheet structures. The fin in the p-type FET has a dendrite structure, which enlarges effective gate length and also increases the performance of hole mobility in the p-type channel. This is particularly useful for small scaled devices. Further, embodiments of the present disclosure can be readily integrated into existing semiconductor manufacturing processes.

In one exemplary aspect, the present disclosure is directed to a method of forming a semiconductor device. The method includes forming a first fin and a second fin, each of the first fin and the second fin having first epitaxial layers and second epitaxial layers, the first epitaxial layers and the second epitaxial layers being alternately arranged; forming a dielectric layer over the first fin and the second fin; exposing a channel region of the first fin; removing the second epitaxial layers in the channel region of the first fin; exposing a channel region of the second fin; recessing the second epitaxial layers between the adjacent first epitaxial layers in the channel region of the second fin; forming a first gate stack over the first fin, the first gate stack surrounding each of the first epitaxial layers in the channel region of the first fin; and forming a second gate stack over the second fin, the second gate stack extending along sidewalls of the first epitaxial layers and the second epitaxial layers in the channel region of the second fin, the second gate stack including a first metal layer, the first metal layer extending directly below at least one of the first epitaxial layers. In some embodiments, the sidewalls of the second epitaxial layers comprise a (110) crystallographic plane. In some embodiments, the sidewalls of the second epitaxial layers comprise a (111) crystallographic plane. In some embodiments, the channel region of the first fin belongs to an n-type transistor and the channel region of the second fin belongs to a p-type transistor. In some embodiments, the second gate stack further comprises a second metal layer, the second metal layer also extending directly below the at least one of the first epitaxial layers. In some embodiments, the first and second metal layers include different metallic elements. In some embodiments, the first metal layer includes TiN and the second metal layer includes TaAlC. In some embodiments, after the recessing of the second epitaxial layers, a width of the second epitaxial layers is less than about one third of the adjacent first epitaxial layers in the channel region of the second fin. In some embodiments, after the recessing of the second epitaxial layers, a lowermost second epitaxial layer is wider than an uppermost first epitaxial layer in the channel region of the second fin. In some embodiments, after the recessing of the second epitaxial layers, in a cross section of the channel region of the second fin, the first epitaxial layers have a curvature shape and the second epitaxial layers have a rectangular shape.

In another exemplary aspect, the present disclosure is directed to a method of forming a semiconductor device. The method includes providing a fin extruding from a substrate, the fin having first epitaxial layers alternating with second epitaxial layers, the first epitaxial layers including a first semiconductor material, the second epitaxial layers including a second semiconductor material different from the first semiconductor material; etching sidewalls of at least one of the second epitaxial layers in a channel region of the fin, such that a width of the at least one of the second epitaxial layers in the channel region after etching is smaller than a width of the first epitaxial layers contacting the at least one of the second epitaxial layers; and forming a gate stack over of the fin, the gate stack engaging both the first epitaxial layers and the second epitaxial layers. In some embodiments, the sidewalls of the at least one of the second epitaxial layers comprise a (110) crystallographic plane. In some embodiments, the gate stack comprising a gate dielectric layer and a gate electrode layer, a portion of the gate electrode layer extending directly below at least one of the first epitaxial layers. In some embodiments, after the etching of the sidewalls, the at least one of the second epitaxial layers extends into a source/drain region of the fin and has a larger width in the source/drain region than in the channel region. In some embodiments, after the etching of the sidewalls, the width of the at least one of the second epitaxial layers in the channel region is smaller than a thickness of the at least one of the second epitaxial layers. In some embodiments, after the etching of the sidewalls, the width of the at least one of the second epitaxial layers in the channel region is larger than a thickness of the at least one of the second epitaxial layers. In some embodiments, after the etching of the sidewalls, a lowermost second epitaxial layer is wider than an uppermost first epitaxial layer in the channel region of the fin. In some embodiments, the first semiconductor material includes Arsenic (As) and the second semiconductor material includes Germanium (Ge).

In yet another exemplary aspect, the present disclosure is directed to a semiconductor device. The semiconductor device includes a substrate; first source/drain regions and a first channel region interposed between the first source/drain regions, the first channel region comprising first epitaxial layers, wherein each of the first epitaxial layers is spaced from others; second source/drain regions and a second channel region interposed between the second source/drain regions, the second channel region comprising alternating layers of the first epitaxial layers and second epitaxial layers, wherein each of the second epitaxial layers has a width smaller than the adjacent first epitaxial layers; a first gate electrode extending over the first channel region, wherein the first gate electrode surrounds each of the first epitaxial layers; and a second gate electrode extending over the second channel region, wherein a portion of the second gate electrode is directly below at least one of the first epitaxial layers. In some embodiments, sidewalls of the second epitaxial layers in the second channel region comprise a (110) crystallographic plane.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   forming a first fin and a second fin, each of the first fin and the second fin having first epitaxial layers and second epitaxial layers, the first epitaxial layers and the second epitaxial layers being alternately arranged;
   forming a dielectric layer over the first fin and the second fin;
   exposing a channel region of the first fin;
   removing the second epitaxial layers in the channel region of the first fin;
   exposing a channel region of the second fin;
   recessing the second epitaxial layers between the adjacent first epitaxial layers in the channel region of the second fin;
   forming a first gate stack over the first fin, the first gate stack surrounding each of the first epitaxial layers in the channel region of the first fin; and
   forming a second gate stack over the second fin, the second gate stack extending along sidewalls of the first epitaxial layers and the second epitaxial layers in the channel region of the second fin, the second gate stack including a first metal layer, the first metal layer extending directly below at least one of the first epitaxial layers.

2. The method of claim 1, wherein the sidewalls of the second epitaxial layers comprise a (110) crystallographic plane.

3. The method of claim 1, wherein the sidewalls of the second epitaxial layers comprise a (111) crystallographic plane.

4. The method of claim 1, wherein the channel region of the first fin belongs to an n-type transistor and the channel region of the second fin belongs to a p-type transistor.

5. The method of claim 1, wherein the second gate stack further comprises a second metal layer, the second metal layer also extending directly below the at least one of the first epitaxial layers.

6. The method of claim 5, wherein the first and second metal layers include different metallic elements.

7. The method of claim 6, wherein the first metal layer includes TiN and the second metal layer includes TaAlC.

8. The method of claim 1, wherein after the recessing of the second epitaxial layers, a width of the second epitaxial layers is less than about one third of the adjacent first epitaxial layers in the channel region of the second fin.

9. The method of claim 1, wherein after the recessing of the second epitaxial layers, a lowermost second epitaxial layer is wider than an uppermost first epitaxial layer in the channel region of the second fin.

10. The method of claim 1, wherein after the recessing of the second epitaxial layers, in a cross section of the channel region of the second fin, the first epitaxial layers have a curvature shape and the second epitaxial layers have a rectangular shape.

11. A method of forming a semiconductor device, comprising:
   providing a fin extruding from a substrate, the fin having first epitaxial layers alternating with second epitaxial layers, the first epitaxial layers including a first semiconductor material, the second epitaxial layers including a second semiconductor material different from the first semiconductor material;
   etching sidewalls of at least one of the second epitaxial layers in a channel region of the fin, such that a width of the at least one of the second epitaxial layers in the channel region after etching is smaller than a width of the first epitaxial layers contacting the at least one of the second epitaxial layers; and forming a gate stack over of the fin, the gate stack engaging both the first epitaxial layers and the second epitaxial layers.

12. The method of claim 11, wherein the sidewalls of the at least one of the second epitaxial layers comprise a (110) crystallographic plane.

13. The method of claim 11, wherein the gate stack comprising a gate dielectric layer and a gate electrode layer, a portion of the gate electrode layer extending directly below at least one of the first epitaxial layers.

14. The method of claim 11, wherein after the etching of the sidewalls, the at least one of the second epitaxial layers extends into a source/drain region of the fin and has a larger width in the source/drain region than in the channel region.

15. The method of claim 11, wherein after the etching of the sidewalls, the width of the at least one of the second epitaxial layers in the channel region is smaller than a thickness of the at least one of the second epitaxial layers.

16. The method of claim 11, wherein after the etching of the sidewalls, the width of the at least one of the second epitaxial layers in the channel region is larger than a thickness of the at least one of the second epitaxial layers.

17. The method of claim 11, wherein after the etching of the sidewalls, a lowermost second epitaxial layer is wider than an uppermost first epitaxial layer in the channel region of the fin.

18. The method of claim 11, wherein the first semiconductor material includes Arsenic (As) and the second semiconductor material includes Germanium (Ge).

19. A semiconductor device, comprising:

a substrate;

first source/drain regions and a first channel region interposed between the first source/drain regions, the first channel region comprising first epitaxial layers, wherein each of the first epitaxial layers is spaced from others;

second source/drain regions and a second channel region interposed between the second source/drain regions, the second channel region comprising alternating layers of the first epitaxial layers and second epitaxial layers, wherein each of the second epitaxial layers has a width smaller than the adjacent first epitaxial layers;

a first gate electrode extending over the first channel region, wherein the first gate electrode surrounds each of the first epitaxial layers; and a second gate electrode extending over the second channel region, wherein a portion of the second gate electrode is directly below at least one of the first epitaxial layers.

20. The semiconductor device of claim 19, wherein sidewalls of the second epitaxial layers in the second channel region comprise a (110) crystallographic plane.

* * * * *